United States Patent
Okazaki et al.

(10) Patent No.: US 9,362,411 B2
(45) Date of Patent: Jun. 7, 2016

(54) SEMICONDUCTOR DEVICE AND MANUFACTURING METHOD THEREOF

(71) Applicants: Kenichi Okazaki, Tochigi (JP); Masatoshi Yokoyama, Tochigi (JP); Masayuki Sakakura, Kanagawa (JP); Yukinori Shima, Gunma (JP); Yosuke Kanzaki, Osaka (JP); Hiroshi Matsukizono, Osaka (JP); Takuya Matsuo, Osaka (JP); Yoshitaka Yamamoto, Nara (JP)

(72) Inventors: Kenichi Okazaki, Tochigi (JP); Masatoshi Yokoyama, Tochigi (JP); Masayuki Sakakura, Kanagawa (JP); Yukinori Shima, Gunma (JP); Yosuke Kanzaki, Osaka (JP); Hiroshi Matsukizono, Osaka (JP); Takuya Matsuo, Osaka (JP); Yoshitaka Yamamoto, Nara (JP)

(73) Assignees: Semiconductor Energy Laboratory Co., Ltd., Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 13/861,587

(22) Filed: Apr. 12, 2013

(65) Prior Publication Data

US 2013/0270555 A1    Oct. 17, 2013

(30) Foreign Application Priority Data

Apr. 16, 2012 (JP) .................. 2012-093303

(51) Int. Cl.
    H01L 21/02    (2006.01)
    H01L 29/786    (2006.01)
    H01L 29/66    (2006.01)

(52) U.S. Cl.
    CPC ...... *H01L 29/7869* (2013.01); *H01L 29/66742* (2013.01); *H01L 21/02172* (2013.01)

(58) Field of Classification Search
    CPC ..................... H01L 29/7869; H01L 29/66742; H01L 21/8234; H01L 29/742; H01L 29/76; H01L 29/772; H01L 21/02172; H01L 21/02414; H01L 21/02483; H01L 21/02566
    USPC ......... 438/142, 149, 150, 151, 285, 104, 478, 438/483; 257/E21.051, E21.37, E29.296, 257/43
    See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Masaya Nakayama et al.; "17a-TL-8 Effect of GaO Layer on IGZO-TFT Channel"; Extended Abstracts (The 57th Spring Meeting 2010), The Japan Society of Applied Physics and Related Societies; Mar. 17, 2010; p. 21-008, with English translation.

(Continued)

*Primary Examiner* — Galina Yushina
(74) *Attorney, Agent, or Firm* — Fish & Richardson P.C.

(57) ABSTRACT

An object is to suppress conducting-mode failures of a transistor that uses an oxide semiconductor film and has a short channel length. A semiconductor device includes a gate electrode 304, a gate insulating film 306 formed over the gate electrode, an oxide semiconductor film 308 over the gate insulating film, and a source electrode 310a and a drain electrode 310b formed over the oxide semiconductor film. The channel length L of the oxide semiconductor film is more than or equal to 1 µm and less than or equal to 50 µm. The oxide semiconductor film has a peak at a rotation angle 2θ in the vicinity of 31° in X-ray diffraction measurement.

8 Claims, 13 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,158,974 B2 | 4/2012 | Yano et al. |
| 8,188,480 B2 | 5/2012 | Itai |
| 8,202,365 B2 | 6/2012 | Umeda et al. |
| 8,203,143 B2 | 6/2012 | Imai |
| 8,357,963 B2 | 1/2013 | Kato et al. |
| 8,624,245 B2 | 1/2014 | Yamazaki |
| 8,779,419 B2 | 7/2014 | Yano et al. |
| 8,858,844 B2 | 10/2014 | Yano et al. |
| 8,927,349 B2 | 1/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102312 A1 | 4/2010 | Yamazaki et al. |
| 2010/0109002 A1 | 5/2010 | Itagaki et al. |
| 2010/0301328 A1* | 12/2010 | Yamazaki et al. .............. 257/43 |
| 2010/0320458 A1 | 12/2010 | Umeda et al. |
| 2010/0320459 A1 | 12/2010 | Umeda et al. |
| 2011/0133191 A1* | 6/2011 | Yamazaki ........... H01L 27/1225 257/57 |
| 2011/0193083 A1 | 8/2011 | Kim et al. |
| 2011/0250723 A1* | 10/2011 | Suzawa et al. ................ 438/151 |
| 2012/0119205 A1 | 5/2012 | Taniguchi et al. |
| 2012/0138922 A1* | 6/2012 | Yamazaki et al. .............. 257/43 |
| 2012/0244658 A1* | 9/2012 | Koezuka et al. .............. 438/104 |
| 2015/0097188 A1 | 4/2015 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-231613 A | 10/2009 |
| JP | 2010-016347 A | 1/2010 |
| JP | 4415062 B1 | 2/2010 |
| JP | 2010-067954 A | 3/2010 |
| JP | 2010-177431 A | 8/2010 |
| JP | 4571221 B1 | 10/2010 |
| JP | 2011-066070 A | 3/2011 |
| JP | 2011-105995 A | 6/2011 |
| JP | 2011-139054 A | 7/2011 |
| JP | 2012-048806 A | 3/2012 |

(56) References Cited

FOREIGN PATENT DOCUMENTS

| JP | 2012-160679 A | 8/2012 |
|---|---|---|
| WO | 2004/114391 A1 | 12/2004 |
| WO | WO-2008/117739 | 10/2008 |
| WO | 2008/133345 A1 | 11/2008 |
| WO | WO-2011/068066 | 6/2011 |
| WO | WO-2012/014790 | 2/2012 |

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation with Ultraviolet Lamp,"Journal of Sol-Gel Science and Technology, 2003, vol. 26, pp. 181-184.

Asaoka, Y et al., "29.1: Polarizer-Free Reflective LCD Combined with Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn—Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg—Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

(56) References Cited

OTHER PUBLICATIONS

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

SEMICONDUCTOR DEVICE AND MANUFACTURING METHOD THEREOF

BACKGROUND OF THE INVENTION

1. Field of the Invention

The present invention relates to a semiconductor device using an oxide semiconductor and a manufacturing method thereof. Note that in this specification, a semiconductor device refers to a semiconductor element itself or a device including a semiconductor element. As an example of such a semiconductor element, for example, a transistor (e.g., a thin film transistor) can be given. In addition, a semiconductor device also refers to a display device such as a liquid crystal display device.

2. Description of the Related Art

A thin film transistor formed over a flat plate such as a glass substrate is manufactured using amorphous silicon or polycrystalline silicon, as typically seen in a liquid crystal display device. A thin film transistor manufactured using amorphous silicon has low field effect mobility, but can be formed over a larger glass substrate. In contrast, a thin film transistor manufactured using crystalline silicon has high field effect mobility, but due to a crystallization step such as laser annealing, such a transistor is not always suitable for being formed over a larger glass substrate.

In view of the foregoing, attention has been drawn to a technique by which a thin film transistor is manufactured using an oxide semiconductor, and such a transistor is applied to an electronic device or an optical device. For example, Patent Document 1 and Patent Document 2 disclose a technique by which a thin film transistor is manufactured using zinc oxide or an In—Ga—Zn—O-based oxide semiconductor as an oxide semiconductor film and such a transistor is used as a switching element or the like of an image display device.

However, it is difficult to reduce a channel length of a thin film transistor using an amorphous In—Ga—Zn-based oxide semiconductor film (hereinafter referred to as an a-IGZO film) because it is brought into a conducting mode in a region with short channel length. Note that the conducting mode in this specification refers to a mode in which normally on characteristics or characteristics of a low on/off ratio which causes flow of current are exhibited.

REFERENCE

Patent Document

[Patent Document 1] Japanese Published Patent Application No. 2007-123861
[Patent Document 2] Japanese Published Patent Application No. 2007-096055

SUMMARY OF THE INVENTION

An object of one embodiment of the present invention is to suppress conducting-mode failures of a transistor that uses an oxide semiconductor film and has a short channel length.

One embodiment of the present invention is a semiconductor device including a gate electrode, an oxide semiconductor film, and a source electrode and a drain electrode, in which the length of a channel formed in the oxide semiconductor film is more than or equal to 1 μm and less than or equal to 50 μm, and in which the oxide semiconductor film has a peak at a rotation angle 2θ of 31° in X-ray diffraction measurement.

Another embodiment of the present invention is a semiconductor device including a gate electrode, an oxide semiconductor film, and a source electrode and a drain electrode, in which the length of a channel formed in the oxide semiconductor film is more than or equal to 1 μm and less than or equal to 50 μm, and in which the oxide semiconductor film has a peak at a rotation angle 2θ in the vicinity of 31° in X-ray diffraction measurement.

In one embodiment of the present invention, it is preferable that the length of the channel be less than 5 μm.

Further in one embodiment of the present invention, it is preferable that the oxide semiconductor film have a band gap of more than or equal to 3.1 eV.

Furthermore in one embodiment of the present invention, it is preferable that the oxide semiconductor film be a film including at least one oxide selected from the group consisting of indium oxide, zinc oxide, gallium oxide, and tin oxide.

Moreover in one embodiment of the present invention, it is preferable that the oxide semiconductor film be an In—Ga—Zn-based oxide semiconductor film. Further in one embodiment of the present invention, it is preferable that the oxide semiconductor film include a crystal part, and that a c-axis of the crystal part be aligned in a direction parallel to a normal vector of a surface on which the oxide semiconductor film is formed.

Still another embodiment of the present invention is a semiconductor device including a gate electrode, an oxide semiconductor film, and a source electrode and a drain electrode, in which the length of a channel formed in the oxide semiconductor film is more than or equal to 1 μm and less than or equal to 50 μm, in which the oxide semiconductor film includes a crystal part, and in which a c-axis of the crystal part is aligned in a direction parallel to a normal vector of a surface on which the oxide semiconductor film is formed. It is preferable that the length of the channel be less than 5 μm. Further, it is preferable that the oxide semiconductor film be an In—Ga—Zn-based oxide semiconductor film.

A still further embodiment of the present invention is a method for manufacturing a semiconductor device, which includes the steps of forming a gate electrode over a substrate; forming a gate insulating film over the gate electrode; forming an oxide semiconductor film over the gate insulating film by heating the substrate and sputtering a metal oxide target under conditions using an oxygen gas and a rare gas; forming an active layer over the gate insulating film by processing the oxide semiconductor film; and forming a source electrode and a drain electrode over the active layer so that the length of a channel formed in the active layer is more than or equal to 1 μm and less than or equal to 50 μm. In the method, the conditions are conditions where the heating temperature of the substrate is more than or equal to 100° C. and the ratio of the flow rate of the oxygen gas to the total gas flow is more than or equal to 70% or conditions where the heating temperature of the substrate is more than or equal to 170° C. and the ratio of the flow rate of the oxygen gas to the total gas flow is more than or equal to 30%. Further, the oxide semiconductor film has a peak at a rotation angle 2θ in the vicinity of 31° in X-ray diffraction measurement.

In one embodiment of the present invention, it is preferable that the metal oxide target be an In—Ga—Zn-based oxide target.

With one embodiment of the present invention, conducting-mode failures of a transistor that uses an oxide semiconductor film and has a short channel length can be suppressed.

DETAILED DESCRIPTION OF THE INVENTION

An embodiment of the present invention will be described below in detail with reference to the accompanying drawings. However, the present invention is not limited to the following description and it is easily understood by those skilled in the art that the mode and details can be variously changed without departing from the scope and spirit of the present invention. Therefore, the invention should not be construed as being limited to the description in the following embodiment.

<CE (Channel-Etched) Structure>

Figure 1A:
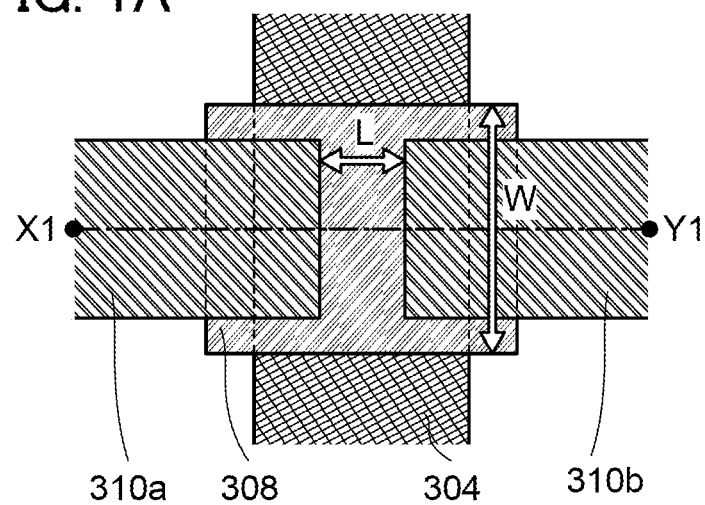
FIG. 1A is a plan view of a semiconductor device of one embodiment of the present invention and FIG. 1B is a cross-sectional view along line X1-Y1 in FIG. 1A.
Figure 1B:
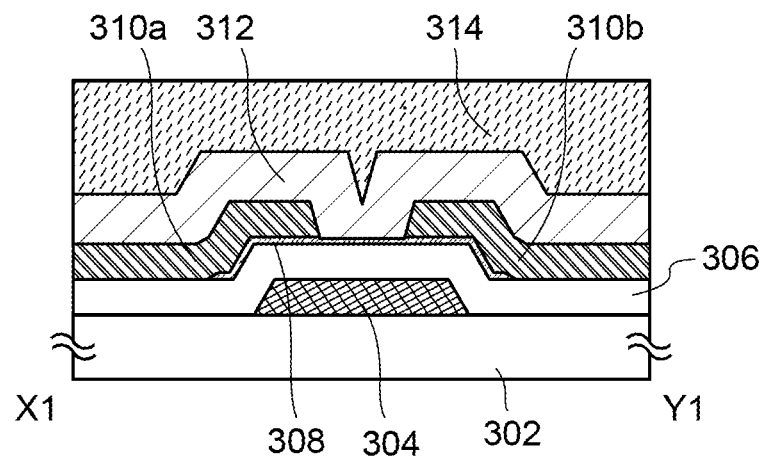

FIG. 1A is a plan view of a semiconductor device of one embodiment of the present invention, and FIG. 1B is a cross-sectional view along line X1-Y1 in FIG. 1A. This semiconductor device includes a transistor having a bottom-gate structure (also referred to as an inverted staggered structure). Note that in FIG. 1A, some components of the transistor (e.g., a gate insulating film 306) are not illustrated for simplicity.

In FIG. 1B, a base insulating film (not shown) is formed over a substrate 302. It is preferable that a region that spreads from a surface to a depth of 3 nm of the base insulating film have a concentration of a metal element that is included in the substrate 302 of $1 \times 10^{18}$ atoms/cm$^3$ or lower.

A gate electrode 304 is formed over the base insulating film. The gate insulating film 306 is formed over the base insulating film and the gate electrode 304. An island-shaped oxide semiconductor film 308 having a channel region is formed over the gate insulating film 306. The oxide semiconductor film 308 is provided in contact with the gate insulating film 306 in a position that overlaps with the gate electrode 304. A source electrode 310a and a drain electrode 310b are formed over the oxide semiconductor film 308 and the gate insulating film 306. The source electrode 310a and the drain electrode 310b are electrically connected to the oxide semiconductor film 308.

The oxide semiconductor film 308 has a channel length of more than or equal to 1 μm and less than or equal to 50 μm (preferably less than 5 μm) and a channel width W (see FIG. 1A). Further, it is preferable that the oxide semiconductor film 308 have a peak at a rotation angle 2θ in the vicinity of 31° in X-ray diffraction measurement and the band gap of the oxide semiconductor film 308 be more than or equal to 3.1 eV. The details of the oxide semiconductor film 308 are described later.

Further, an interlayer insulating film 312 and a planarization insulating film 314 may be provided over the transistor. In detail, the interlayer insulating film 312 may be provided over the oxide semiconductor film 308, the source electrode 310a, and the drain electrode 310b, and the planarization insulating film 314 may be provided over the interlayer insulating film 312.

With this embodiment using the oxide semiconductor film 308 having a peak at a rotation angle 2θ in the vicinity of 31° in X-ray diffraction measurement and having a band gap of more than or equal to 3.1 eV, the transistor that uses the oxide semiconductor film and has a short channel length can have suppressed conducting-mode failures. In this specification and the like, having a peak at a rotation angle 2θ in the vicinity of 31° means having a peak at a rotation angle 2θ of 31° with an error of plus or minus 1°.

[Detailed Description of Oxide Semiconductor Film]

The oxide semiconductor film 308 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary is not found in the CAAC-OS film. Thus, in the CAAC-OS film, a reduction in electron mobility due to the grain boundary is suppressed.

In each of the crystal parts included in the CAAC-OS film, a c-axis is aligned in a direction parallel to a normal vector of a surface on which the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification and the like, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface on which the CAAC-OS film is formed or a normal vector of a surface of the CAAC-OS film, the directions of the c-axes may be different from each other depending on the shape of the CAAC-OS film (the cross-sectional shape of the surface on which the CAAC-OS film is formed or the cross-sectional shape of the surface of the CAAC-OS film).

Note that the c-axes of the crystal parts are aligned in the direction parallel to a normal vector of the surface on which the CAAC-OS film is formed or a normal vector of the surface of the CAAC-OS film. The crystal parts are formed by film formation or by performing treatment for crystallization such as heat treatment after film formation.

With use of the CAAC-OS film in a transistor, change in electrical characteristics of the transistor due to irradiation with visible light or ultraviolet light can be reduced. Change and variation in threshold voltage can be suppressed. Thus, the transistor has high reliability.

In a crystal part or a crystalline oxide semiconductor film, defects in the bulk can be further reduced. Further, when the surface flatness of the crystal part or the crystalline oxide semiconductor film is enhanced, a transistor including the oxide semiconductor film can have higher field-effect mobility than a transistor including an amorphous oxide semiconductor film. In order to improve the surface flatness of the oxide semiconductor film, the oxide semiconductor film is preferably formed over a flat surface. Specifically, the oxide semiconductor is preferably formed over a surface with an average surface roughness (Ra) of less than or equal to 0.15 nm, preferably less than or equal to 0.1 nm.

Note that the average surface roughness Ra is obtained by expanding center line average surface roughness that is defined by JIS B 0601 into three dimensions for application to a surface, and Ra can be expressed as the average value of the absolute values of deviations from a reference surface to a specific surface and is defined by Formula 1.

$$Ra = \frac{1}{S_0} \int_{y_2}^{y_1} \int_{x_2}^{x_1} |f(x, y) - Z_0| \, dx \, dy \qquad \text{[FORMULA 1]}$$

In the above formula, $S_0$ represents the area of a measurement surface (a rectangular region which is defined by four points at coordinates $(x_1, y_1)$, $(x_1, y_2)$, $(x_2, y_1)$, and $(x_2, y_2)$), and $Z_0$ represents the average height of the measurement surface. Ra can be measured using an atomic force microscope (AFM).

For the oxide semiconductor film, an oxide semiconductor having a wider band gap than that of silicon, i.e., 1.1 eV, is preferably used. For example, an In—Ga—Zn-based oxide having a band gap of 3.15 eV, an indium oxide having a band gap of about 3.0 eV, an indium tin oxide having a band gap of about 3.0 eV, an indium gallium oxide having a band gap of about 3.3 eV, an indium zinc oxide having a band gap of about 2.7 eV, a tin oxide having a band gap of about 3.3 eV, a zinc oxide having a band gap of about 3.37 eV, or the like can be preferably used. With the use of such a material, the off-state current of the transistor can be kept extremely low. Note that in one embodiment of the present invention, the band gap of the oxide semiconductor film is preferably more than or equal to 3.1 eV.

An oxide semiconductor used for the oxide semiconductor film preferably includes at least one selected from the group consisting of indium (In), zinc (Zn), and gallium (Ga). In particular, In and Zn are preferably included. As a stabilizer for reducing a variation in electrical characteristics among transistors including the oxide semiconductor, tin (Sn) is preferably included.

For example, as the oxide semiconductor, any of the following can be used: indium oxide; tin oxide; zinc oxide; a two-component metal oxide such as an In—Zn-based oxide, a Sn—Zn-based oxide, or In—Ga-based oxide; a three-component metal oxide such as an In—Ga—Zn-based oxide (also referred to as IGZO), In—Sn—Zn-based oxide, Sn—Ga—Zn-based oxide; and a four-component metal oxide such as an In—Sn—Ga—Zn-based oxide.

Here, an "In—Ga—Zn-based oxide" means an oxide including In, Ga, and Zn as its main components and there is no particular limitation on the ratio of In:Ga:Zn. The In—Ga—Zn-based oxide may include a metal element other than the In, Ga, and Zn.

Alternatively, a material represented by $In/MO_3(ZnO)_m$ (m>0, m is not an integer) may be used as an oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$ (n>0, n is an integer) may be used.

For example, an In—Ga—Zn-based oxide with an atomic ratio where In:Ga:Zn=1:1:1, In:Ga:Zn=3:1:2, or In:Ga:Zn=2:1:3, or an oxide whose composition is in the neighborhood of the above compositions can be used.

In a formation step of the oxide semiconductor film, it is preferable that hydrogen or water be contained in the oxide semiconductor film as little as possible. For example, it is preferable that the substrate be preheated in a preheating chamber of a sputtering apparatus as pretreatment for formation of the oxide semiconductor film so that an impurity such as hydrogen or moisture adsorbed to the substrate are eliminated and removed. Then, the oxide semiconductor film is preferably formed in a film formation chamber from which remaining moisture is removed.

In order to remove the moisture in the preheating chamber and the film formation chamber, an entrapment vacuum pump, for example, a cryopump, an ion pump, or a titanium sublimation pump is preferably used. Further, an evacuation unit may be a turbo pump provided with a cold trap. From the preheating chamber and the film formation chamber which are evacuated with a cryopump, a hydrogen atom, a compound containing a hydrogen atom such as water ($H_2O$) (preferably, also a compound containing a carbon atom), and the like are removed, whereby the concentration of an impurity such as hydrogen or moisture in the oxide semiconductor film can be reduced.

Note that an In—Ga—Zn-based oxide film is formed as the oxide semiconductor film by a sputtering method. The oxide semiconductor film can be formed by a sputtering method in a rare gas (typically argon) atmosphere, an oxygen atmosphere, or a mixed atmosphere of a rare gas and oxygen.

As a target used for forming an In—Ga—Zn-based oxide film as the oxide semiconductor film by a sputtering method, for example, a metal oxide target with an atomic ratio where In:Ga:Zn=1:1:1, a metal oxide target with an atomic ratio where In:Ga:Zn=3:1:2, or a metal oxide target with an atomic ratio where In:Ga:Zn=2:1:3 can be used. However, a material and composition of a target used for formation of the oxide semiconductor film are not limited to the above.

Further, when the oxide semiconductor film is formed using the above metal oxide target, the composition of the film formed over the substrate is different from the composition of the target in some cases. For example, when the metal oxide target of In:Ga:Zn=1:1:1 [atomic ratio] is used, the composition of the oxide semiconductor film, which is a thin film, becomes In:Ga:Zn=1:1:0.6 to 1:1:0.8 [atomic ratio] in some cases, although it depends on the film formation conditions. This is because in formation of the oxide semiconductor film, Zn is sublimed, or because the sputtering rate differs between the components of In, Ga, and Zn.

Accordingly, in order to form a thin film having a desired composition ratio, the composition of the metal oxide target needs to be adjusted in advance. For example, in order to make the composition of the oxide semiconductor film, which is a thin film, be In:Ga:Zn=1:1:1 [atomic ratio], the composition of the metal oxide target is preferably In:Ga:Zn=1:1:1.5 [atomic ratio]. In other words, the percentage of Zn content in the metal oxide target is preferably made higher in advance. The composition of the target is not limited to the above value, and can be adjusted as appropriate depending on the film formation conditions or the composition of the thin film to be formed. Further, it is preferable to increase the percentage of Zn content in the metal oxide target because the obtained thin film can have higher crystallinity.

The relative density of the metal oxide target with respect to a single crystal consisting of the same material as the metal oxide target is more than or equal to 90% and less than or equal to 100%, preferably more than or equal to 95% and less than or equal to 99.9%. By using the metal oxide target with high relative density with respect to a single crystal consisting of the same material as the metal oxide target, a dense oxide semiconductor film can be formed.

As a sputtering gas used for forming the oxide semiconductor film, it is preferable to use a high-purity gas from which impurities such as hydrogen, water, hydroxyl groups, or hydrides are removed.

There are three methods for forming a CAAC-OS film when the CAAC-OS film is used as the oxide semiconductor film. The first method is to form an oxide semiconductor film at a temperature higher than or equal to 100° C. and lower than or equal to 450° C., whereby crystal parts in which the c-axes are aligned in the direction parallel to a normal vector of a surface on which the oxide semiconductor film is formed or a normal vector of a surface of the oxide semiconductor film are formed in the oxide semiconductor film. The second method is to form an oxide semiconductor film with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor film are formed in the oxide semiconductor film. The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the second oxide semiconductor film.

By heating the substrate during film formation, the concentration of an impurity such as hydrogen or water in the formed oxide semiconductor film can be reduced. In addition, damage by sputtering can be reduced, which is preferable. The oxide semiconductor film may be formed by an ALD (atomic layer deposition) method, an evaporation method, a coating method, or the like.

Note that when a crystalline (single-crystal or microcrystalline) oxide semiconductor film other than a CAAC-OS film is formed as the oxide semiconductor film, the film formation temperature is not particularly limited.

As a method for processing the oxide semiconductor film, a wet etching method or a dry etching method can be used to etch the oxide semiconductor film. An etching gas such as $BCl_3$, $Cl_2$, or $O_2$ can be used in the dry etching method. Further, a dry etching apparatus using a high-density plasma source such as electron cyclotron resonance (ECR) or inductive coupled plasma (ICP) can be used to improve a dry etching rate.

After the oxide semiconductor film is formed, the oxide semiconductor film may be subjected to heat treatment. The temperature of the heat treatment is higher than or equal to 300° C. and lower than or equal to 700° C., or lower than the strain point of the substrate. Through the heat treatment, excess hydrogen (including water and a hydroxyl group) contained in the oxide semiconductor film can be removed. Note that the heat treatment is also referred to as dehydration treatment (dehydrogenation treatment) in this specification and the like in some cases.

The heat treatment can be performed in such a manner that, for example, an object is introduced into an electric furnace in which a resistance heater or the like is used and heated at 450° C. in a nitrogen atmosphere for an hour. The oxide semiconductor film is not exposed to the air during the heat treatment so that entry of water or hydrogen can be prevented.

Note that a heat treatment apparatus is not limited to an electric furnace, and may be a device for heating an object by heat conduction or heat radiation from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen or a rare gas such as argon is used.

For example, as the heat treatment, the GRTA process may be performed as follows. The object is put in a heated inert gas atmosphere, heated for several minutes, and taken out of the inert gas atmosphere. The GRTA process enables high-temperature heat treatment in a short time. Moreover, the GRTA process can be employed even when the temperature exceeds the upper temperature limit of the object. Note that the inert gas may be switched to a gas including oxygen during the process.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The dehydration treatment (dehydrogenation treatment) might be accompanied by elimination of oxygen which is a main constituent material for an oxide semiconductor film, leading to a reduction in oxygen. An oxygen vacancy exists in a portion where oxygen is eliminated in an oxide semiconductor film, and a donor level which leads to a change in the electrical characteristics of a transistor is formed owing to the oxygen vacancy. Therefore, in the case where the dehydration treatment (dehydrogenation treatment) is performed, oxygen is preferably supplied to the oxide semiconductor film. By supply of oxygen to the oxide semiconductor film, an oxygen vacancy in the film can be filled.

The oxygen vacancy in the oxide semiconductor film may be filled in the following manner for example: after the oxide semiconductor film is subjected to the dehydration treatment (dehydrogenation treatment), a high-purity oxygen gas, a nitrous oxide gas, a high-purity nitrous oxide gas, or ultra dry air (the moisture amount is less than or equal to 20 ppm (−55° C. by conversion into a dew point), preferably less than or equal to 1 ppm, further preferably less than or equal to 10 ppb, in the measurement with the use of a dew point meter of a cavity ring down laser spectroscopy (CRDS) system) is introduced into the same furnace. It is preferable that water, hydrogen, and the like be not contained in the oxygen gas or the nitrous oxide gas. The purity of the oxygen gas or the nitrous oxide gas which is introduced into the heat treatment apparatus is preferably 6N (99.9999%) or more, further preferably 7N (99.99999%) or more (i.e., the impurity concentration in the oxygen gas or the nitrous oxide gas is preferably less than or equal to 1 ppm, further preferably less than or equal to 0.1 ppm).

As an example of a method of supplying oxygen to the oxide semiconductor film, oxygen (including at least any one of oxygen radicals, oxygen atoms, and oxygen ions) may be added to the oxide semiconductor film. An ion implantation method, an ion doping method, a plasma immersion ion implantation method, plasma treatment, or the like can be used as a method for adding oxygen.

As another example of a method for supplying oxygen to the oxide semiconductor film, the base insulating film, the gate insulating film to be formed later, or the like may be heated to release part of oxygen and supply oxygen to the oxide semiconductor film.

As described above, after formation of the oxide semiconductor film, it is preferable that dehydration treatment (dehydrogenation treatment) be performed to remove hydrogen or moisture from the oxide semiconductor film so that the oxide semiconductor film is highly purified to contain as few impurities as possible, and that oxygen be added to the oxide semiconductor in which oxygen is reduced by the dehydration treatment (dehydrogenation treatment) or excess oxygen is supplied to fill oxygen vacancies in the oxide semiconductor film. Supplying oxygen to an oxide semiconductor film may be expressed as oxygen adding treatment or treatment for making an oxygen-excess state.

In this manner, hydrogen or moisture is removed from the oxide semiconductor film by dehydration treatment (dehydrogenation treatment) and an oxygen vacancy therein is filled by oxygen adding treatment, whereby the oxide semiconductor film can be turned into an electrically i-type (intrinsic) or substantially i-type oxide semiconductor film. Specifically, the concentration of hydrogen in the oxide semiconductor film is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$. Note that the concentration of hydrogen in the oxide semiconductor film is measured by secondary ion mass spectrometry (SIMS).

The number of carriers generated due to a donor in the oxide semiconductor film, in which hydrogen concentration is reduced to a sufficiently low concentration so that the oxide semiconductor film is purified and in which defect states in an energy gap due to oxygen deficiency are reduced by sufficiently supplying oxygen as described above, is very small (close to zero); the carrier concentration in the oxide semiconductor film is less than $1\times10^{12}$/cm$^3$, preferably less than $1\times10^{11}$/cm$^3$, further preferably less than $1.45\times10^{10}$/cm$^3$. In a transistor including such an oxide semiconductor film, the off-state current (per unit channel width (1 μm) here) at room temperature (25° C.), for example, is less than or equal to 100 zA (1 zA (zeptoampere) is $1\times10^{-21}$ A), preferably less than or equal to 10 zA, further preferably less than or equal to 100 yA (1 yA (yoctoampere) is $1\times10^{-24}$ A). The transistor with very excellent off-state current characteristics can be obtained with the use of such an i-type (intrinsic) or substantially i-type oxide semiconductor.

<Method for Manufacturing Transistor>

Next, a method for manufacturing the semiconductor device illustrated in FIG. 1B is described. First, a base insulating film (not shown) is formed over the substrate 302.

As the substrate 302, a substrate of a glass material such as aluminosilicate glass, aluminoborosilicate glass, barium borosilicate glass, or the like is used. In terms of mass production, a mother glass with the following size is preferably used for the substrate 302: the 8th generation (2160 mm×2460 mm); the 9th generation (2400 mm×2800 mm, or 2450 mm×3050 mm); the 10th generation (2950 mm×3400 mm); or the like. A mother glass considerably shrinks when the treatment temperature is high and the treatment time is long. Thus, in the case where mass production is performed with the use of the mother glass, the heating temperature in the manufacturing process is preferably 600° C. or lower, further preferably 450° C. or lower, still further preferably 350° C. or lower.

As the base insulating film, a film of silicon oxide, silicon oxynitride, silicon nitride oxide, silicon nitride, aluminum oxide, or the like can be used. The aluminum oxide film is formed by a sputtering method and preferably has a density of 3.2 g/cm$^3$ or more, further preferably 3.6 g/cm$^3$ or more. With the use of the above-described aluminum oxide film as the base insulating film, an impurity can be prevented from being diffused from the substrate 302 into the transistor. The impurity from the substrate 302 is, for example, hydrogen, a metal element, or the like. As the metal element, elements such as sodium, aluminum, magnesium, calcium, strontium, barium, silicon, and boron can be given. The base insulating film can be formed to a thickness of more than or equal to 5 nm and less than or equal to 150 nm (preferably more than or equal to 10 nm and less than or equal to 100 nm).

In a region that spreads from a surface to a depth of 3 nm of the base insulating film, the concentration of a metal element that is included in the glass substrate is preferably $1\times10^{18}$ atoms/cm$^3$ or lower.

The base insulating film is preferably a film which releases a small amount of water ($H_2O$) or hydrogen ($H_2$). For example, an aluminum oxide film can be used as the base insulating film. It is preferable that the amount of water ($H_2O$) released from the aluminum oxide film be less than or equal to $5\times10^{15}$ atoms/cm$^3$, further preferably less than or equal to $1\times10^{15}$ atoms/cm$^3$. Further, it is preferable that the amount of hydrogen ($H_2$) released from the aluminum oxide film be less than or equal to $5\times10^{15}$ atoms/cm$^3$, further preferably less than or equal to $1\times10^{15}$ atoms/cm$^3$.

For example, in the case where a film which releases a large amount of hydrogen or water is used as the base insulating film, there is a possibility that water or hydrogen is released from the base insulating film in a process of forming the transistor and diffused into the oxide semiconductor film 308 in the transistor. By using the base insulating film which releases the above-described amount of hydrogen or water, an impurity diffused into the transistor can be reduced, which leads to a highly reliable semiconductor device.

Note that the amount of released water and the amount of released hydrogen can be measured by thermal desorption spectroscopy (TDS).

Next, after a conductive film is formed over the base insulating film, the gate electrode 304 is formed by a photolithography step and an etching step, and then, the gate insulating film 306 is formed over the base insulating film and the gate electrode 304.

The gate electrode 304 can be formed by a sputtering method or the like to have a single-layer structure or a stacked-layer structure using a metal material such as molybdenum, titanium, tantalum, tungsten, aluminum, copper, neodymium, or scandium, or an alloy material containing at least any one of these materials.

The gate insulating film 306 can be formed by, for example, a PE-CVD method or the like, using silicon oxide, gallium oxide, aluminum oxide, silicon nitride, silicon oxynitride, aluminum oxynitride, silicon nitride oxide, or the like. The thickness of the gate insulating film 306 can be, for example, more than or equal to 10 nm and less than or equal to 500 nm, preferably more than or equal to 50 nm and less than or equal to 300 nm. A film that can prevent diffusion of an impurity from the substrate 302 can be used as the gate insulating film 306; in such a case, the base insulating film can be omitted.

It is preferable that the gate insulating film 306 include oxygen in a portion which is in contact with the oxide semiconductor film 308 to be formed later. In particular, the gate insulating film 306 preferably includes oxygen in an amount which exceeds at least the stoichiometric composition. For example, in the case where silicon oxide is used for the gate insulating film 306, the composition formula is preferably $SiO_{2+\alpha}$ ($\alpha>0$). In this embodiment, silicon oxide of $SiO_{2+\alpha}$ ($\alpha>0$) is used for the gate insulating film 306. By using this silicon oxide for the gate insulating film 306, oxygen can be supplied to the oxide semiconductor film 308 to be formed later and thus the oxide semiconductor film 308 can have excellent electrical characteristics.

The gate insulating film 306 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide. By using such a material, gate leakage current can be reduced. Further, the gate insulating film 306 may have either a single-layer structure or a stacked-layer structure.

Next, heat treatment may be performed on the substrate 302 provided with the gate insulating film 306.

The heat treatment can be performed using, for example, an electric furnace or an apparatus for heating an object by heat conduction or heat radiation from a heating element such as a resistance heating element. A rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object by heat treatment, such as nitrogen or a rare gas like argon, is used. Alternatively, oxygen may be used as another high-temperature gas. When oxygen is used, release of oxygen from the gate insulating film 306 can be inhibited or supply of oxygen to the gate insulating film 306 can be performed.

In the case where the mother glass is used as the substrate 302, because high treatment temperature and long treatment time considerably shrink the mother glass, the treatment temperature of the heat treatment is preferably higher than or equal to 200° C. and lower than or equal to 450° C., further preferably higher than or equal to 250° C. and lower than or equal to 350° C.

An impurity such as water or hydrogen in the gate insulating film 306 can be removed by the heat treatment. Further, by the heat treatment, the defect density in the gate insulating film 306 can be reduced. The reduction of the impurity in the gate insulating film 306 or the defect density in the film leads to improvement in reliability of the semiconductor device. For example, degradation of the semiconductor device by a negative bias stress test with light irradiation, which is one of the reliability tests for semiconductor devices, can be suppressed.

The heat treatment may be performed as pretreatment for formation of the oxide semiconductor film 308 to be formed later. For example, after the gate insulating film 306 is formed, heat treatment may be performed in a vacuum in a preheating chamber of a sputtering apparatus and the oxide semiconductor film 308 may then be formed.

Furthermore, the heat treatment may be performed more than once. For example, after the gate insulating film 306 is formed, heat treatment may be performed in a nitrogen atmosphere with an electric furnace or the like, then heat treatment may be performed in a vacuum in a preheating chamber of a sputtering apparatus, and then the oxide semiconductor film 308 may then be formed.

Next, an oxide semiconductor film is formed over the gate insulating film 306, and a photolithography step and an etching step are performed; thus, the island-shaped semiconductor film 308 is formed.

The oxide semiconductor film 308 and a manufacturing method thereof are described in detail in the section [Detailed Description of Oxide Semiconductor Film]. In one embodiment of the present invention, the oxide semiconductor film 308 serving as an active layer over the gate insulating film 306 is preferably formed in such a manner that an In—Ga—Zn-based oxide target is sputtered under first and second conditions using an oxygen gas and a rare gas while the substrate 302 is heated to form an oxide semiconductor film over the gate insulating film 306, and the oxide semiconductor film is processed. The first conditions are preferably conditions where the heating temperature of the substrate 302 is more than or equal to 100° C. and the ratio of the flow rate of the oxygen gas to the total gas flow is more than or equal to 70%. The second conditions are preferably conditions where the heating temperature of the substrate 302 is more than or equal to 170° C. and the ratio of the flow rate of the oxygen gas to the total gas flow is more than or equal to 30%. In this manner, the oxide semiconductor film 308 having a peak at a rotation angle 2θ in the vicinity of 31° in X-ray diffraction measurement and having a band gap of more than or equal to 3.1 eV can be formed.

Next, a conductive film is formed over the gate insulating film 306 and the oxide semiconductor film 308 and is subjected to a photolithography step and an etching step, whereby the source electrode 310a and the drain electrode 310b which are electrically connected to the oxide semiconductor film 308 are formed. The channel length L of the oxide semiconductor film 308 is more than or equal to 1 μm and less than or equal to 50 μm, preferably less than 5 μm. At this stage, the transistor is formed.

A conductive film used for the source electrode 310a and the drain electrode 310b is formed using a metal film including an element selected from Al, Cr, Cu, Ta, Ti, Mo, and W, or a metal nitride film including any of the above elements as a component (a titanium nitride film, a molybdenum nitride film, or a tungsten nitride film) can be used. Alternatively, a structure in which a film of a high-melting-point metal such as Ti, Mo, or W or a metal nitride film thereof (a titanium nitride film, a molybdenum nitride film, or a tungsten nitride film) is formed over or/and below a metal film such as an Al film or a Cu film, may be employed.

Next, the interlayer insulating film 312 and the planarization insulating film 314 are formed over the transistor. The interlayer insulating film 312 can be formed using the same material and method as the gate insulating film 306.

As the planarization insulating film 314, for example, an organic resin material such as a polyimide-based resin, an acrylic-based resin, or a benzocyclobutene-based resin can be used. With the planarization insulating film 314, the surface roughness of the transistor can be reduced.

Further, a conductive film (not shown) may be formed over the planarization insulating film 314. For the conductive film, a conductive material with a light-transmitting property such as indium oxide-tin oxide (ITO: indium tin oxide) or indium oxide-zinc oxide can be used. Note that the material of the conductive film is not limited to the above. For example, a metal film (a film of aluminum, titanium, or the like) may be used. Such a metal film is preferably used because the transistor can be shielded from external light.

The conductive film also has a function of shielding the transistor from static charges (what is called an electrostatic discharge: ESD). With the conductive film over the transistor, charge due to electrostatic discharge or the like can be dissipated.

Through the above-described manufacturing steps, the semiconductor device illustrated in FIG. 1B can be manufactured.

The back channel side in the channel-etched structure is exposed to plasma treatment at the time of channel etching. In the case where vacancies are generated in the active layer, long channel length L makes it difficult to generate conducting-mode failures, and short channel length L makes it easy to generate conducting-mode failures. However, in the channel-etched structure in one embodiment of the present invention, the oxide semiconductor film 308 formed using IGZO that has a peak at a rotation angle 2θ in the vicinity of 31° in X-ray diffraction measurement and has a band gap of more than or equal to 3.1 eV is used. The use of the oxide semiconductor film 308 can decrease the probability of generating vacancies in the oxide semiconductor film 308, thereby suppressing conducting-mode failures.

As described above, even the transistor that uses an oxide semiconductor film and has a short channel length L can have suppressed conducting-mode failures. Accordingly, manufacture of a transistor with short channel length is possible; the channel length can be less than 5 μm, or less than or equal to 2 μm. Consequently, transistors with a wide range of channel length/channel width (L/W) can be manufactured. Further, since the channel length can be shortened, the size of the transistor can be reduced. This is advantageous for improvements in aperture ratio and definition in the case of using the transistor in a panel, or can reduce a driver region to reduce the frame size in the case of using the transistor in a driver.

EXAMPLE 1

In Example 1, oxide semiconductor films including indium, gallium, and zinc (expressed as IGZO films below) were formed, and the band gap (also referred to as energy gap and expressed as Eg below) and the crystallinity of each of the IGZO films were evaluated. Note that in Eg evaluation, values measured by spectroscopic ellipsometry were evaluated, and in crystallinity evaluation, measurement was performed using X-ray diffraction (XRD) (this measurement is expressed as XRD measurement below).

The IGZO films (Sample 1 to Sample 18) were formed using a metal oxide target with an atomic ratio of In:Ga:Zn=1:1:1 under fixed conditions where the film formation pressure was 0.6 Pa, the film formation power was 5 kw, and the film thickness was 100 nm, at various substrate temperatures and various $O_2$ flow rates (various ratios of $O_2$ flow rate). The details of the conditions for Sample 1 to Sample 18 are described below.

(Sample 1)
Substrate temperature=room temperature (R.T.), $O_2$ flow rate=200 sccm (ratio of $O_2$ flow rate=100%)
(Sample 2)
Substrate temperature=room temperature (R.T.), Ar/$O_2$ flow rates=100/100 sccm (ratio of $O_2$ flow rate=50%)
(Sample 3)
Substrate temperature=room temperature (R.T.), Ar/$O_2$ flow rates=180/20 sccm (ratio of $O_2$ flow rate=10%)
(Sample 4)
Substrate temperature=100° C., $O_2$ flow rate=200 sccm (ratio of $O_2$ flow rate=100%)
(Sample 5)
Substrate temperature=100° C., Ar/$O_2$ flow rates=60/140 sccm (ratio of $O_2$ flow rate=70%)
(Sample 6)
Substrate temperature=100° C., Ar/$O_2$ flow rates=100/100 sccm (ratio of $O_2$ flow rate=50%)
(Sample 7)
Substrate temperature=100° C., Ar/$O_2$ flow rates=140/60 sccm (ratio of $O_2$ flow rate=30%)
(Sample 8)
Substrate temperature=100° C., Ar/$O_2$ flow rates=180/20 sccm (ratio of $O_2$ flow rate=10%)
(Sample 9)
Substrate temperature=170° C., $O_2$ flow rate=200 sccm (ratio of $O_2$ flow rate=100%)
(Sample 10)
Substrate temperature=170° C., Ar/$O_2$ flow rates=60/140 sccm (ratio of $O_2$ flow rate=70%)
(Sample 11)
Substrate temperature=170° C., Ar/$O_2$ flow rates=100/100 sccm (ratio of $O_2$ flow rate=50%)
(Sample 12)
Substrate temperature=170° C., Ar/$O_2$ flow rates=140/60 sccm (ratio of $O_2$ flow rate=30%)
(Sample 13)
Substrate temperature=170° C., Ar/$O_2$ flow rates=180/20 sccm (ratio of $O_2$ flow rate=10%)
(Sample 14)
Substrate temperature=200° C., $O_2$ flow rate=200 sccm (ratio of $O_2$ flow rate=100%)
(Sample 15)
Substrate temperature=200° C., Ar/$O_2$ flow rates=60/140 sccm (ratio of $O_2$ flow rate=70%)
(Sample 16)
Substrate temperature=200° C., Ar/$O_2$ flow rates=100/100 sccm (ratio of $O_2$ flow rate=50%)

(Sample 17)
Substrate temperature=200° C., Ar/O$_2$ flow rates=140/60 sccm (ratio of O$_2$ flow rate=30%)
(Sample 18)
Substrate temperature=200° C., Ar/O$_2$ flow rates=180/20 sccm (ratio of O$_2$ flow rate=10%).

Figure 2A:
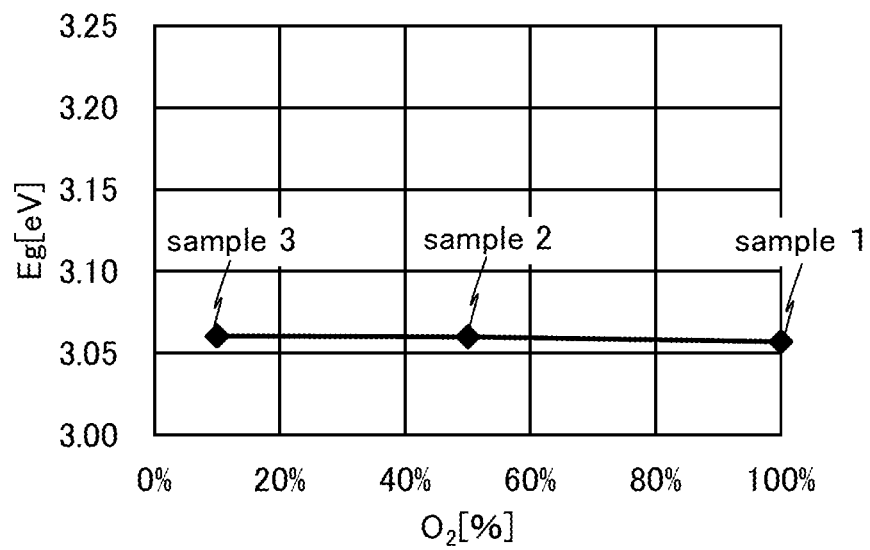
FIG. 2A shows results for Sample 1 to Sample 3 and FIG. 2B shows results for Sample 4 to Sample 8 in Example 1.
Figure 2B:
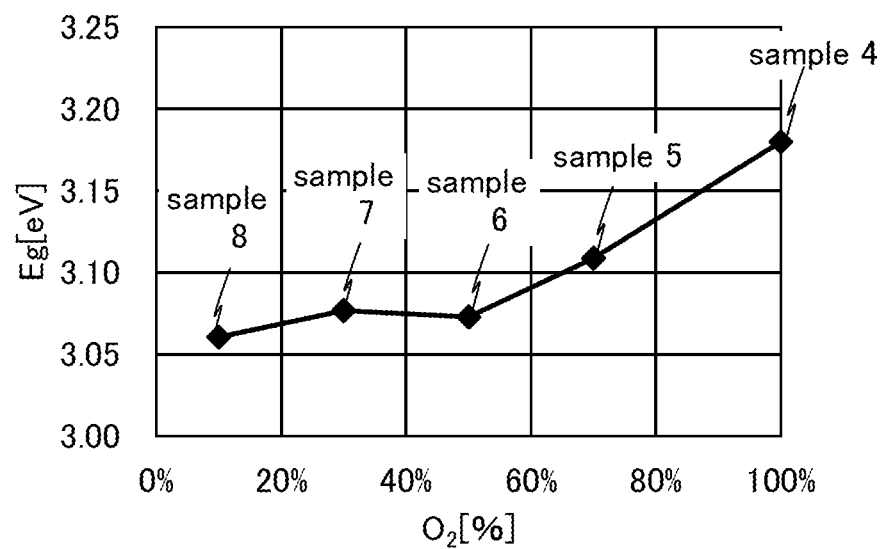
Figure 3A:
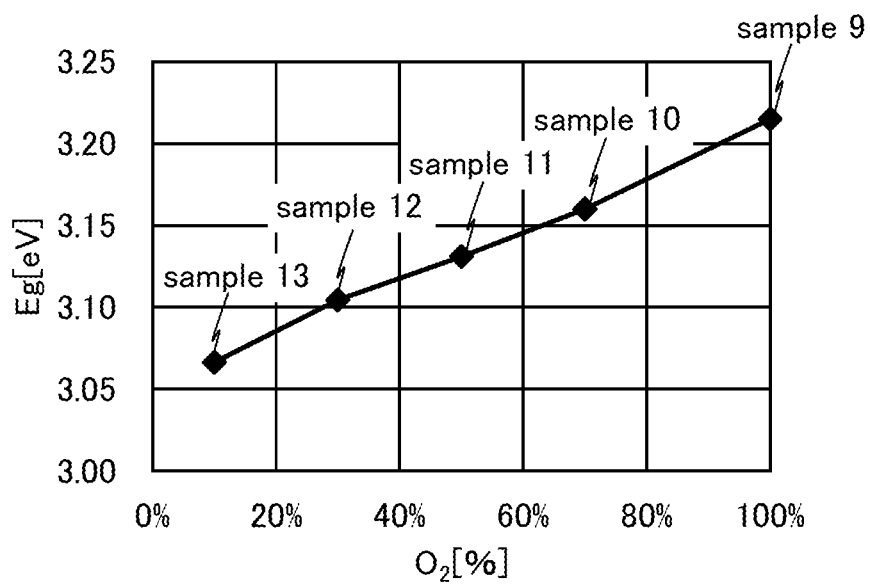
FIG. 3A shows results for Sample 9 to Sample 13 and FIG. 3B shows results for Sample 14 to Sample 18 in Example 1.
Figure 3B:
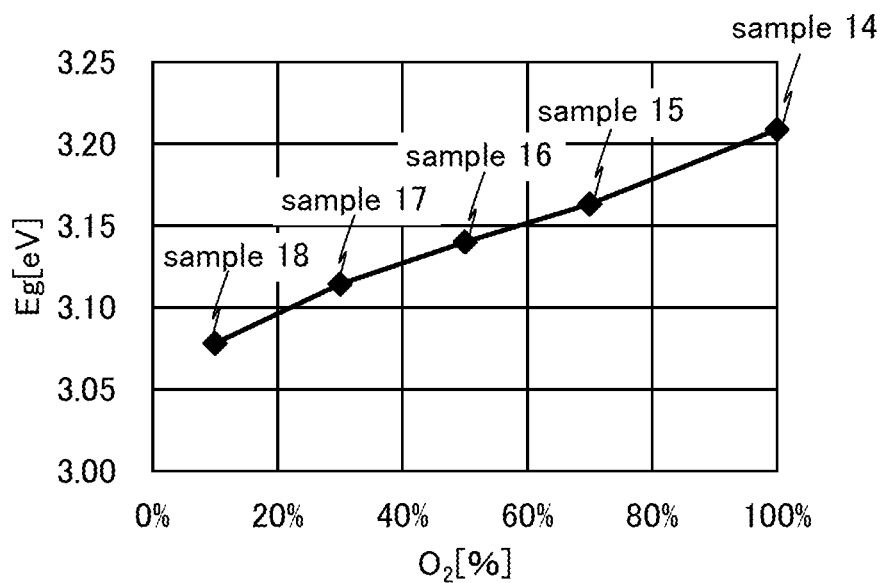

First, the results of the Eg measurement by spectroscopic ellipsometry are shown in FIGS. 2A and 2B and FIGS. 3A and 3B. FIG. 2A shows the results for Sample 1 to Sample 3, FIG. 2B shows the results for Sample 4 to Sample 8, FIG. 3A shows the results for Sample 9 to Sample 13, and FIG. 3B shows the results for Sample 14 to 18. In FIGS. 2A and 2B and FIGS. 3A and 3B, the vertical axis represents Eg (eV), and the horizontal axis represents the ratio of O$_2$ flow rate (%).

FIG. 2A indicates that under the condition where the substrate temperature is room temperature (R.T.), Eg is almost constant at around 3.06 eV with varying ratio of O$_2$ flow rate. Further, FIG. 2B indicates that under the condition where the substrate temperature is 100° C., Eg increases in accordance with an increase in the ratio of O$_2$ flow rate and that Sample 5 with a ratio of O$_2$ flow rate of 70% and Sample 4 with a ratio of O$_2$ flow rate of 100% have an Eg value of more than 3.10 eV. Furthermore, FIG. 3A indicates that under the condition where the substrate temperature is 170° C., Eg increases in accordance with an increase in the ratio of O$_2$ flow rate and that Sample 12 with a ratio of O$_2$ flow rate of 30%, Sample 11 with a ratio of O$_2$ flow rate of 50%, Sample 10 with a ratio of O$_2$ flow rate of 70%, and Sample 9 with a ratio of O$_2$ flow rate of 100% have an Eg value of more than 3.10 eV. Further, FIG. 3B indicates that under the condition where the substrate temperature is 200° C., Eg increases in accordance with an increase in the ratio of O$_2$ flow rate and that Sample 17 with a ratio of O$_2$ flow rate of 30%, Sample 16 with a ratio of O$_2$ flow rate of 50%, Sample 15 with a ratio of O$_2$ flow rate of 70%, and Sample 14 with a ratio of O$_2$ flow rate of 100% have an Eg value of more than 3.10 eV.

The above results show that Eg of the IGZO film can be controlled by changing the substrate temperature and the ratio of O$_2$ flow rate, which are film formation conditions of the IGZO film.

Figure 4A:
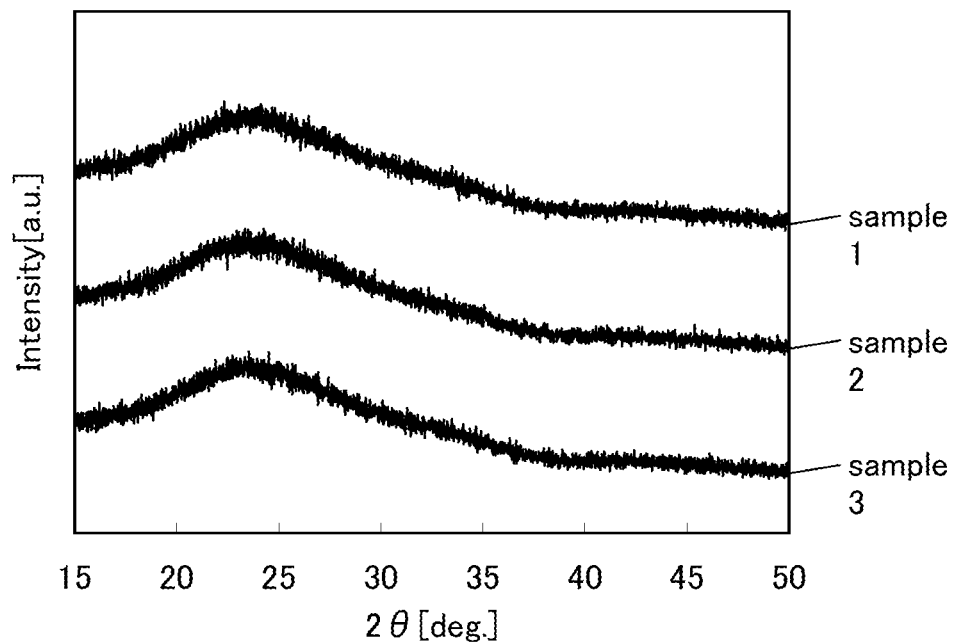
FIG. 4A shows results for Sample 1 to Sample 3 and FIG. 4B shows results for Sample 4 to Sample 8 in Example 1.
Figure 4B:
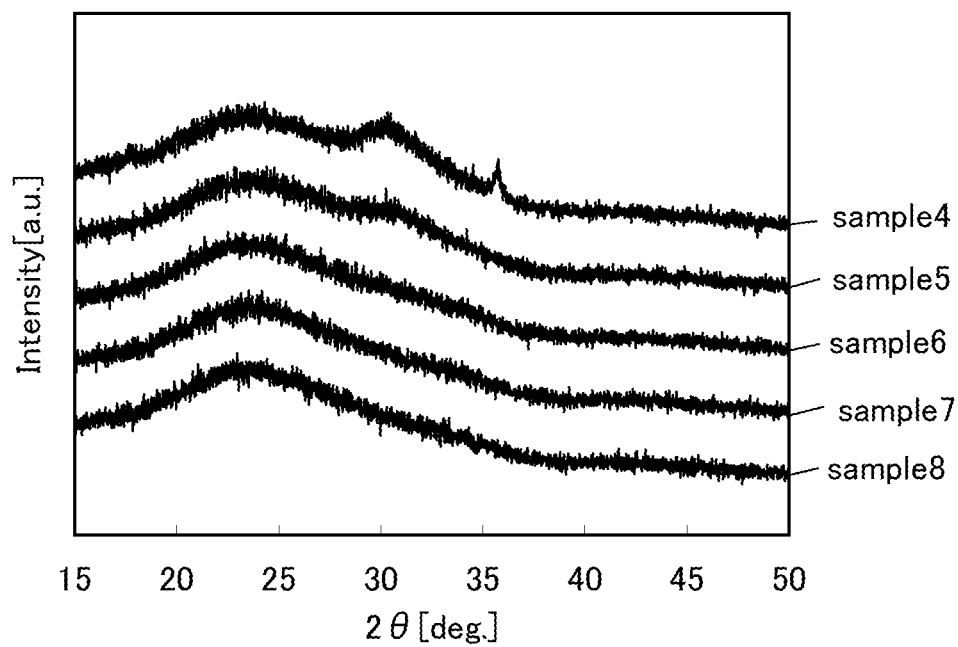
Figure 5A:
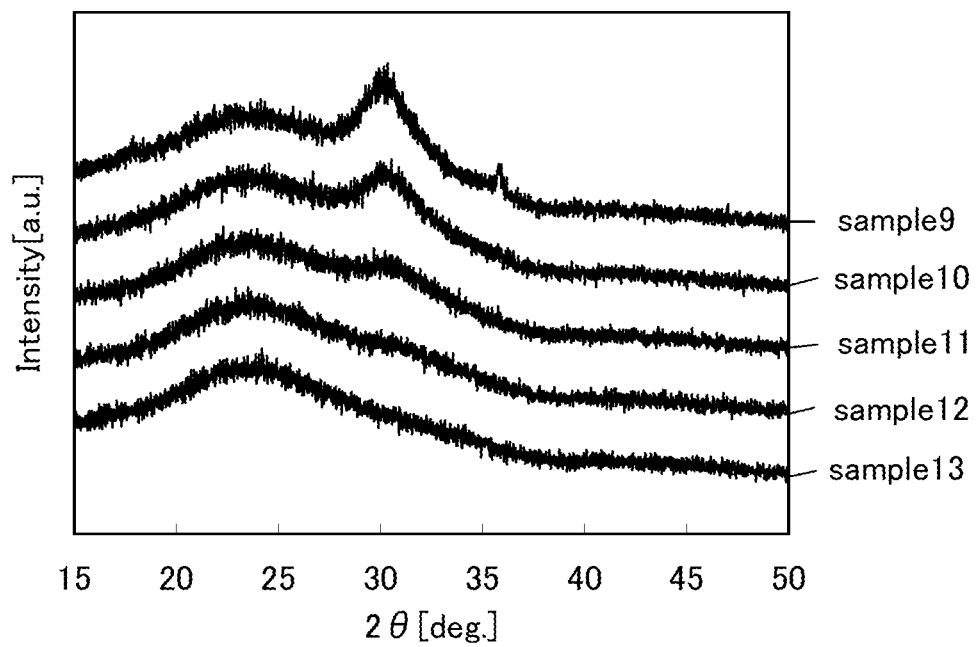
FIG. 5A shows results for Sample 9 to Sample 13 and FIG. 5B shows results for Sample 14 to Sample 18 in Example 1.
Figure 5B:
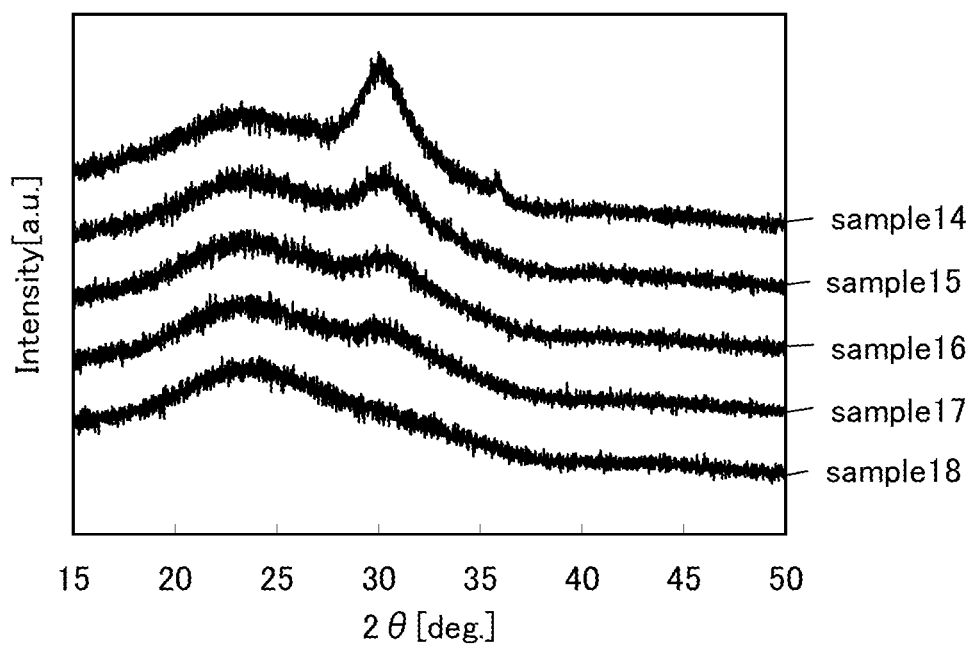

Next, the results of XRD measurement are shown in FIGS. 4A and 4B and FIGS. 5A and 5B. FIG. 4A shows the results for Samples 1 to Sample 3, FIG. 4B shows the results for Sample 4 to Sample 8, FIG. 5A shows the results for Sample 9 to Sample 13, and FIG. 5B shows the results for Sample 14 to Sample 18. In FIGS. 4A and 4B and FIGS. 5A and 5B, the vertical axis represents the intensity of X-ray diffraction (arbitrary unit), and the horizontal axis represents the rotation angle 2θ (deg.).

In FIG. 4A, no peak that indicates crystallinity is observed for Sample 1 to Sample 3 with a substrate temperature of room temperature (R.T.). In FIG. 4B, no peak that indicates crystallinity is observed for Sample 8, Sample 7, and Sample 6 with a substrate temperature of 100° C. and ratios of O$_2$ flow rate of 10%, 30%, and 50%. Meanwhile for Sample 5 and Sample 4 with a substrate temperature of 100° C. and ratios of O$_2$ flow rate of 70% and 100%, peaks indicating crystallinity are observed at 2θ of in the vicinity of 31°. Further in FIG. 5A, no peak that indicates crystallinity is observed for Sample 13 with a substrate temperature of 170° C. and a ratio of O$_2$ flow rate of 10%. Meanwhile for Sample 12, Sample 11, Sample 10, and Sample 9 with a substrate temperature of 170° C. and ratios of O$_2$ flow rate of 30%, 50%, 70%, and 100%, peaks indicating crystallinity are observed at 2θ of in the vicinity of 31°. Furthermore, in FIG. 5B, no peak that indicates crystallinity is observed for Sample 18 with a substrate temperature of 200° C. and a ratio of O$_2$ flow rate of 10%. Meanwhile for Sample 17, Sample 16, Sample 15, and Sample 14 with a substrate temperature of 200° C. and ratios of O$_2$ flow rate of 30%, 50%, 70%, and 100%, peaks indicating crystallinity are observed at 2θ in the vicinity of 31°.

Note that the peak indicating crystallinity at 2θ in the vicinity of 31° indicates a crystal part having a c-axis aligned in a direction parallel to a normal vector of a surface on which the IGZO film is formed, and therefore indicates that the IGZO film is what is called in this specification a CAAC-OS film.

The above results show that the crystallinity of the IGZO film can be controlled by changing the substrate temperature and the ratio of O$_2$ flow rate, which are film formation conditions of the IGZO film.

Here, the substrate temperature, ratio of O$_2$ flow rate, Eg, and peak at 2θ in the vicinity of 31° of Sample 1 to Sample 18 are shown in Table 1.

TABLE 1

|  | Substrate temperature (° C.) | Ratio of O$_2$ flow rate (%) | Eg (eV) | Peak at 2θ in the vicinity of 31° |
| --- | --- | --- | --- | --- |
| Sample 1 | R.T. | 100% | 3.06 | Not observed |
| Sample 2 | R.T. | 50% | 3.06 | Not observed |
| Sample 3 | R.T. | 10% | 3.06 | Not observed |
| Sample 4 | 100° C. | 100% | 3.18 | Observed |
| Sample 5 | 100° C. | 70% | 3.11 | Observed |
| Sample 6 | 100° C. | 50% | 3.07 | Not observed |
| Sample 7 | 100° C. | 30% | 3.08 | Not observed |
| Sample 8 | 100° C. | 10% | 3.06 | Not observed |
| Sample 9 | 170° C. | 100% | 3.21 | Observed |
| Sample 10 | 170° C. | 70% | 3.16 | Observed |
| Sample 11 | 170° C. | 50% | 3.13 | Observed |
| Sample 12 | 170° C. | 30% | 3.10 | Observed |
| Sample 13 | 170° C. | 10% | 3.07 | Not observed |
| Sample 14 | 200° C. | 100% | 3.21 | Observed |
| Sample 15 | 200° C. | 70% | 3.16 | Observed |
| Sample 16 | 200° C. | 50% | 3.14 | Observed |
| Sample 17 | 200° C. | 30% | 3.11 | Observed |
| Sample 18 | 200° C. | 10% | 3.08 | Not observed |

As shown in FIGS. 2A and 2B, FIGS. 3A and 3B, FIGS. 4A and 4B, FIGS. 5A and 5B, and Table 1, there is a correlation between Eg and the peak at 2θ in the vicinity of 31° indicating crystallinity of the IGZO film: the IGZO films having Eg of more than 3.1 eV exhibit peaks indicating crystallinity at 2θ in the vicinity of 31°. In other words, it can be said that an IGZO film having Eg of 3.1 eV or more is a CAAC-OS film.

EXAMPLE 2

In Example 2, transistors with the use of oxide semiconductor films including indium, gallium, and zinc (expressed as IGZO films below) were made, and electrical characteristics of the transistors were evaluated.

A plan view of the transistors made in this example is illustrated in FIG. 1A, and a cross-sectional view of the transistors is illustrated in FIG. 1B. FIG. 1B corresponds to a cross-sectional view taken along line X1-Y1 in FIG. 1A. Note that in FIG. 1A, some components of the transistors (e.g., a gate insulating film 306) are not illustrated for simplicity. The details of the transistors made in this example are described below.

A glass substrate was used as a substrate 302. A titanium film (thickness: 100 nm) was used as a gate electrode 304. A film of stacked layers of a silicon nitride film (thickness: 325 nm) and a silicon oxynitride film (thickness: 50 nm) was used as a gate insulating film 306. Further, an IGZO film (thickness: 50 nm) formed by a sputtering method using a metal oxide target with an atomic ratio of In:Ga:Zn=1:1:1 was used as an IGZO film 308. The IGZO film was, after the film formation, subjected to heat treatment at 450° C. for 1 hour in the air. Then, a titanium film (thickness: 100 nm) was used as a source electrode 310a and a drain electrode 310b. Further, a silicon oxynitride film (thickness: 265 nm) was used as an interlayer insulating film 312, and an acrylic resin (thickness: 2.3 μm) was used as a planarization insulating film 314.

The IGZO film 308 was formed under fixed conditions where the film formation pressure was 0.3 Pa, and the film formation power was 11 kw (DC power source, the power density was 3.3 W/cm$^2$), at various substrate temperatures and various $O_2$ flow rates (various ratios of $O_2$ flow rate) (Conditions A to Conditions D). The details of Conditions A to Conditions D are described below.
(Conditions A)
Substrate temperature=100° C., Ar/$O_2$ flow rates=90/10 sccm (ratio of $O_2$ flow rate=10%)
(Conditions B)
Substrate temperature=100° C., Ar/$O_2$ flow rates=50/50 sccm (ratio of $O_2$ flow rate=50%)
(Conditions C)
Substrate temperature=200° C., Ar/$O_2$ flow rates=90/10 sccm (ratio of $O_2$ flow rate=10%)
(Conditions D)
Substrate temperature=200° C., Ar/$O_2$ flow rates=50/50 sccm (ratio of $O_2$ flow rate=50%).

A plurality of transistors each having the structure illustrated in FIGS. 1A and 1B was formed under each of the above-described Conditions A to Conditions D. Note that six conditions of the channel length L (L is indicated in FIG. 1A) were set for the transistors: 2 μm, 3 μm, 4 μm, 12 μm, 46 μm, and 96 μm; and the channel widths W (W is indicated in FIG. 1A) of the transistors were fixed at 2θ μm. Twelve transistors were formed for each channel length L for each conditions, and electrical characteristics of the transistors were evaluated.

Figure 6A:
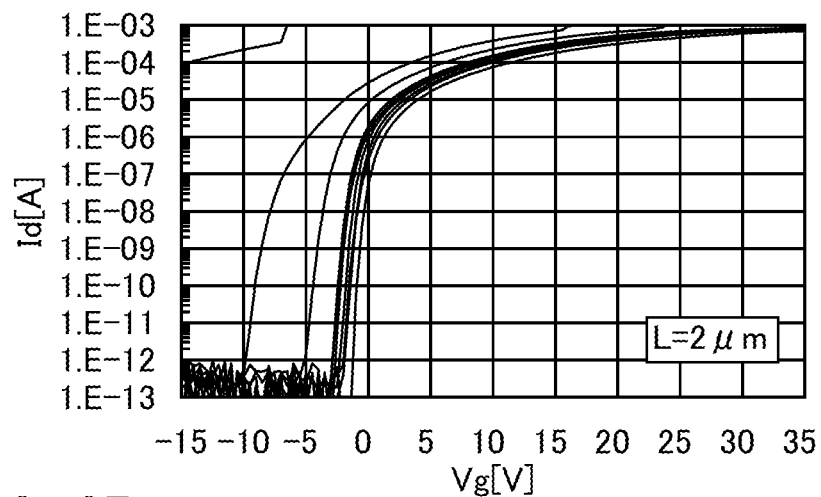
FIGS. 6A to 6C show results of electrical characteristics of transistors with channel lengths of 2, 3, 4 μm formed under Conditions A in Example 2.
Figure 6B:
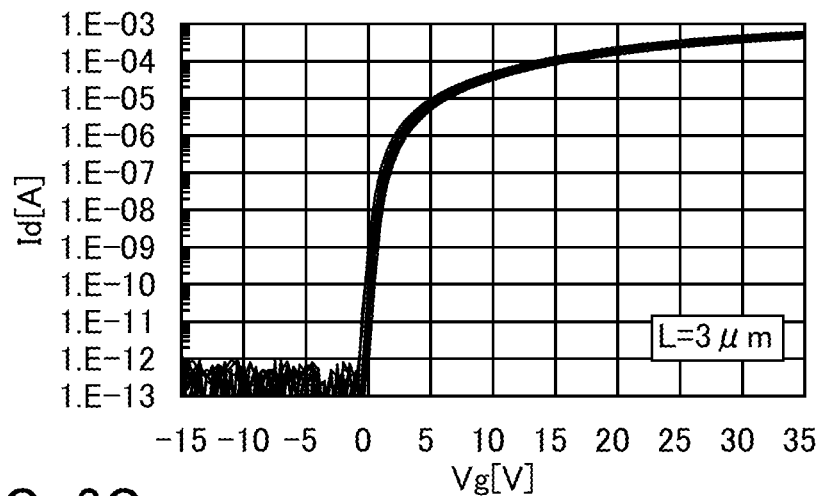
Figure 6C:
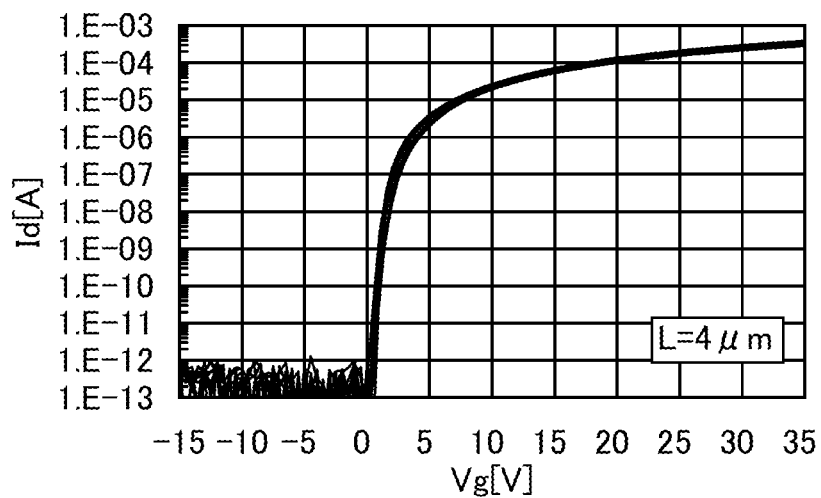
Figure 7A:
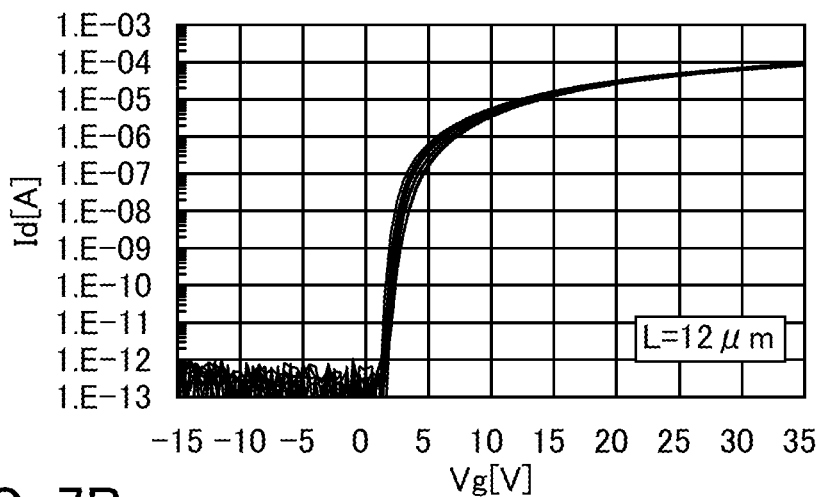
FIGS. 7A to 7C show results of electrical characteristics of transistors with channel lengths of 12, 46, 96 μm formed under Conditions A in Example 2.
Figure 7B:
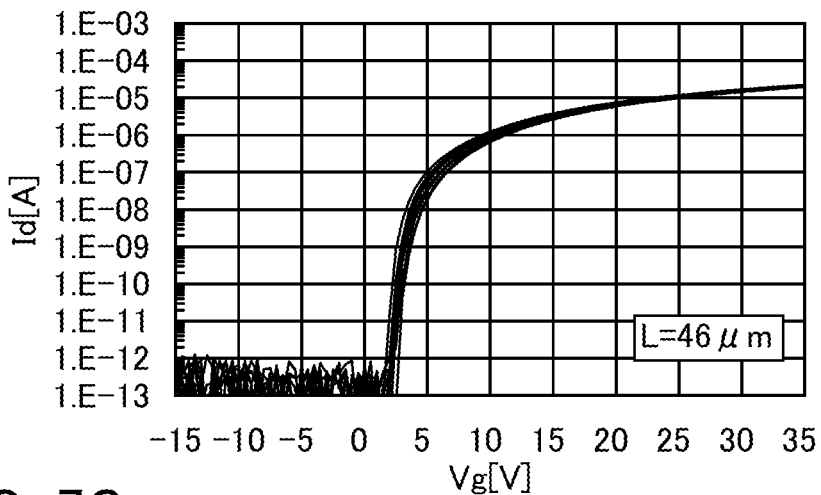
Figure 7C:
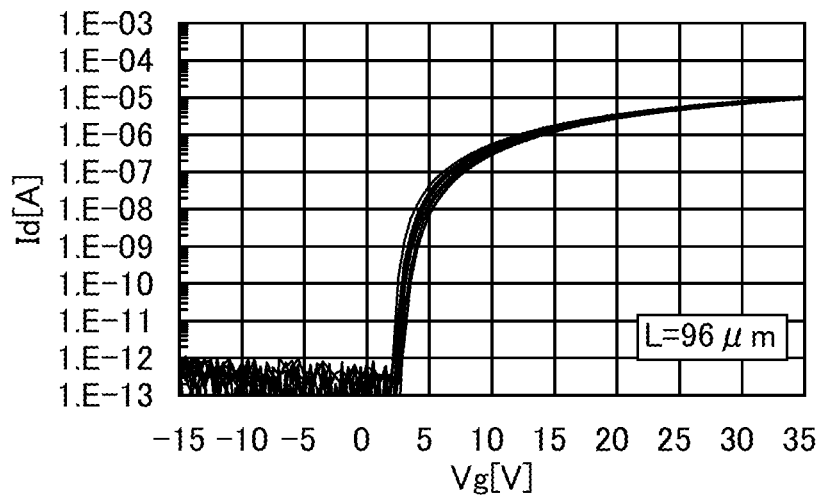
Figure 8A:
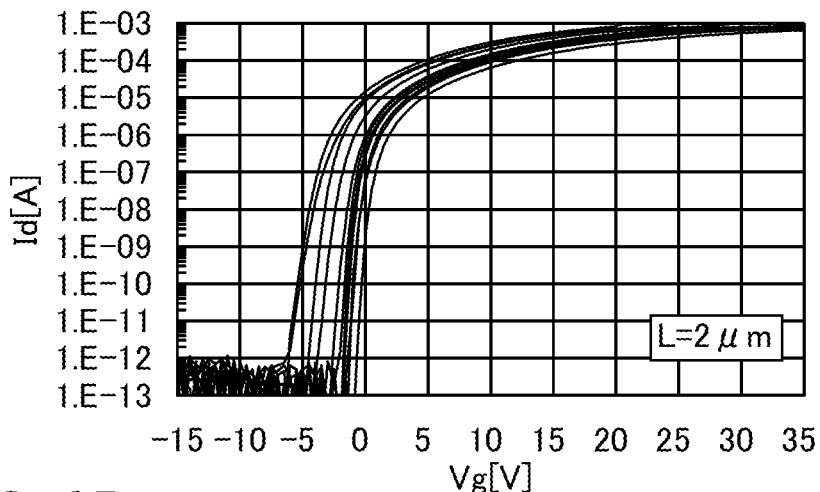
FIGS. 8A to 8C show results of electrical characteristics of transistors with channel lengths of 2, 3, 4 μm formed under Conditions B in Example 2.
Figure 8B:
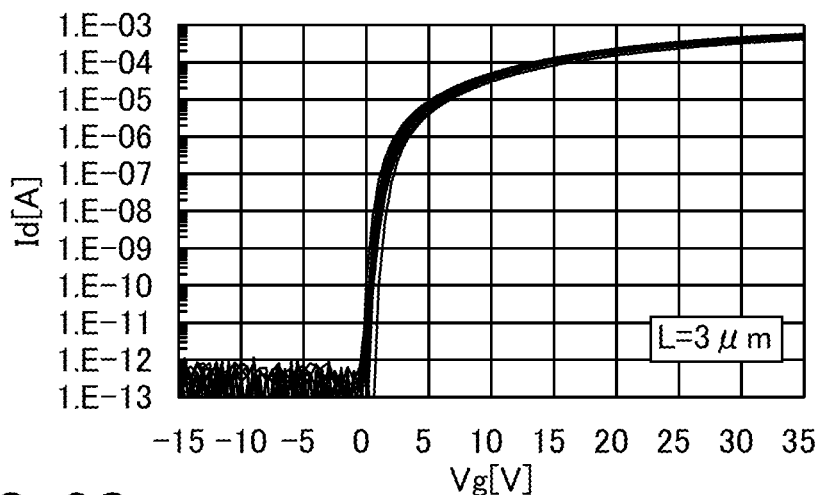
Figure 8C:
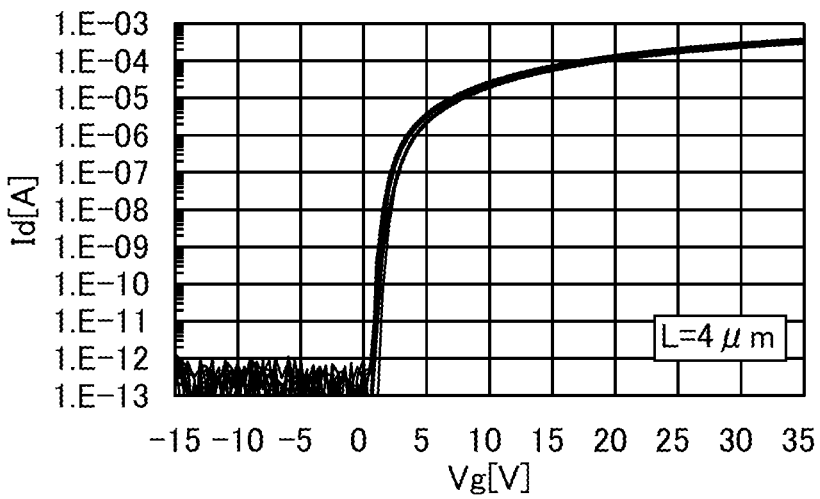
Figure 9A:
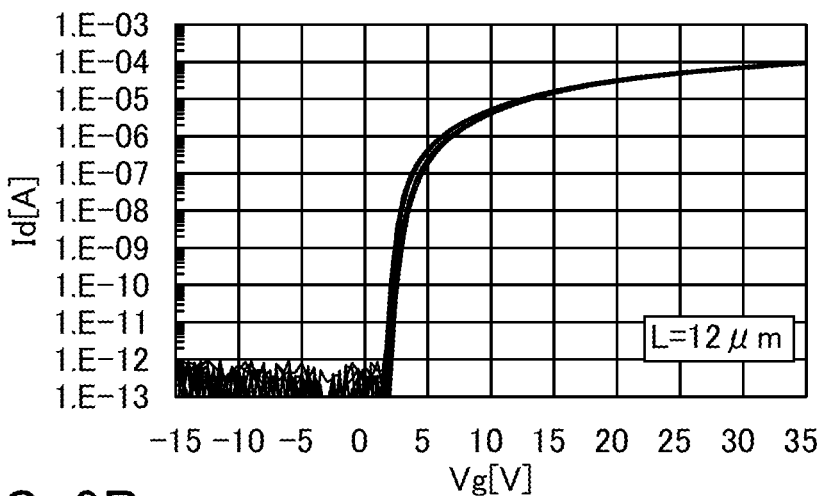
FIGS. 9A to 9C show results of electrical characteristics of transistors with channel lengths of 12, 46, 96 μm formed under Conditions B in Example 2.
Figure 9B:
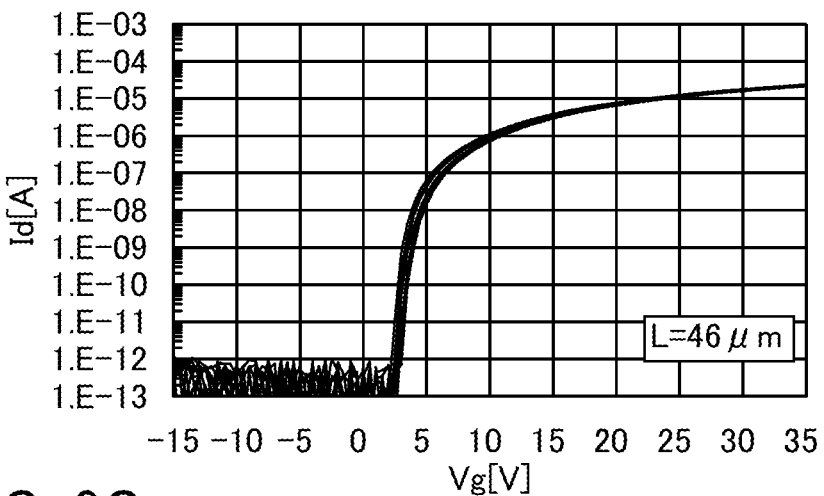
Figure 9C:
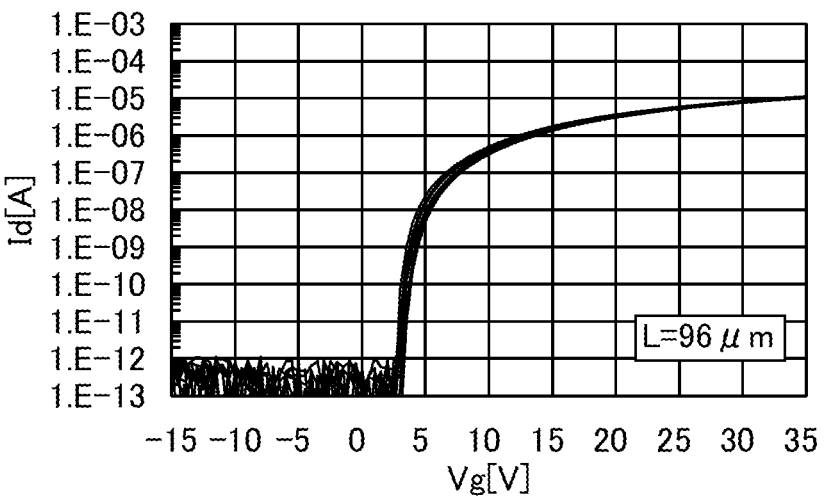
Figure 10A:
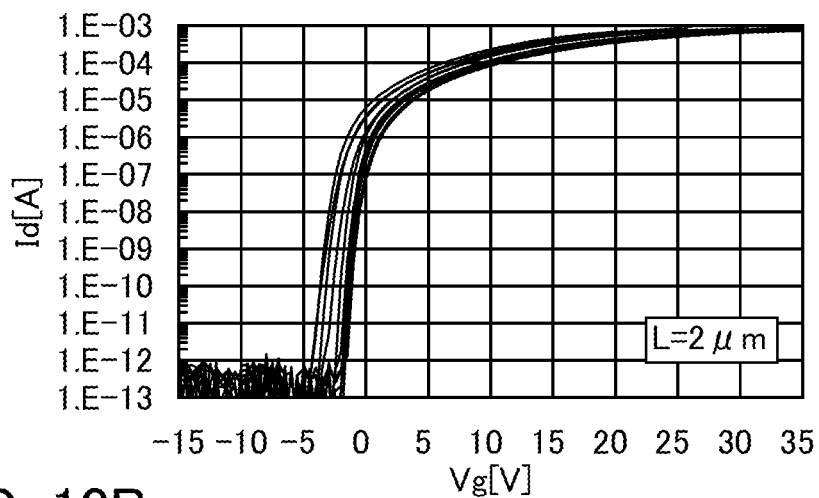
FIGS. 10A to 10C show results of electrical characteristics of transistors with channel lengths of 2, 3, 4 μm formed under Conditions C in Example 2.
Figure 10B:
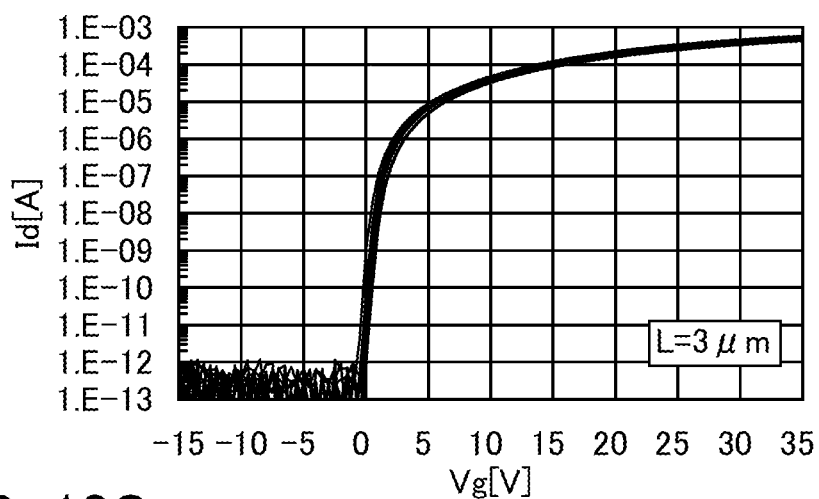
Figure 10C:
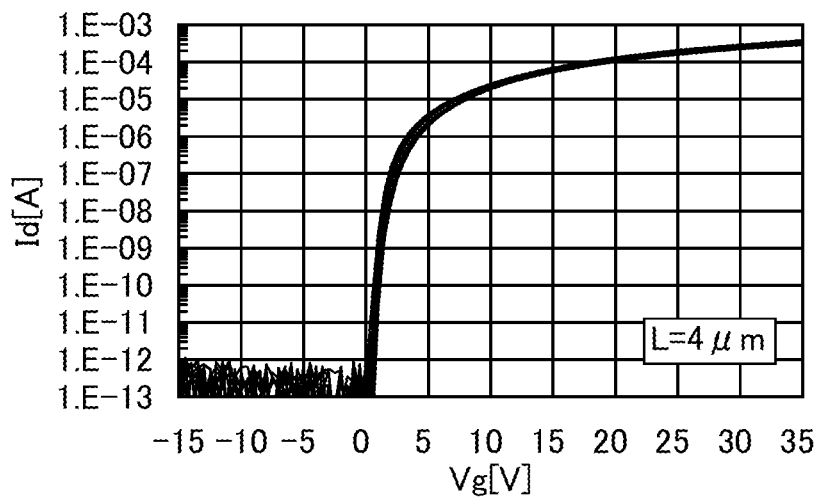
Figure 11A:
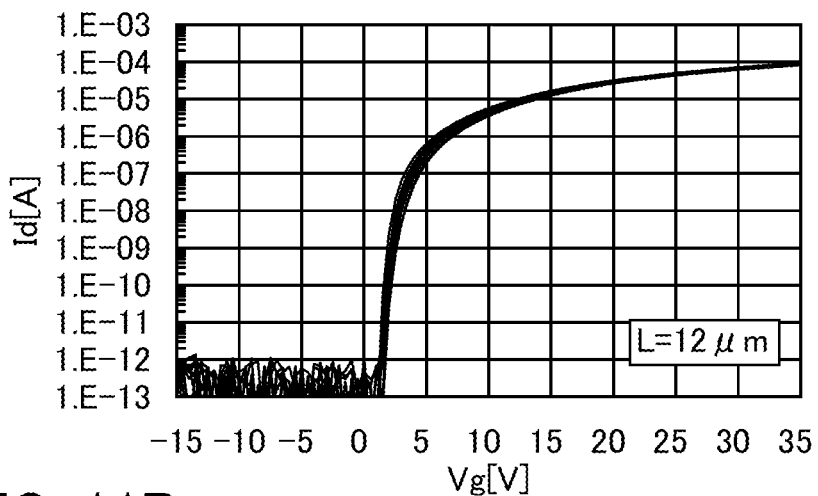
FIGS. 11A to 11C show results of electrical characteristics of transistors with channel lengths of 12, 46, 96 μm formed under Conditions C in Example 2.
Figure 11B:
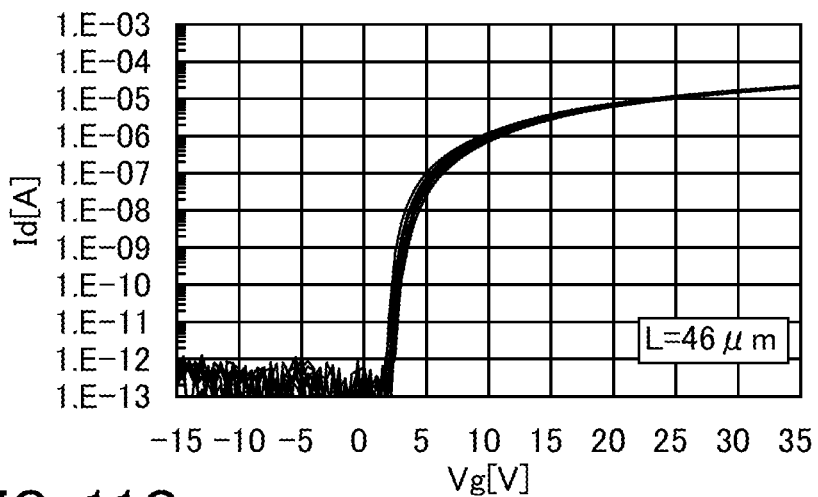
Figure 11C:
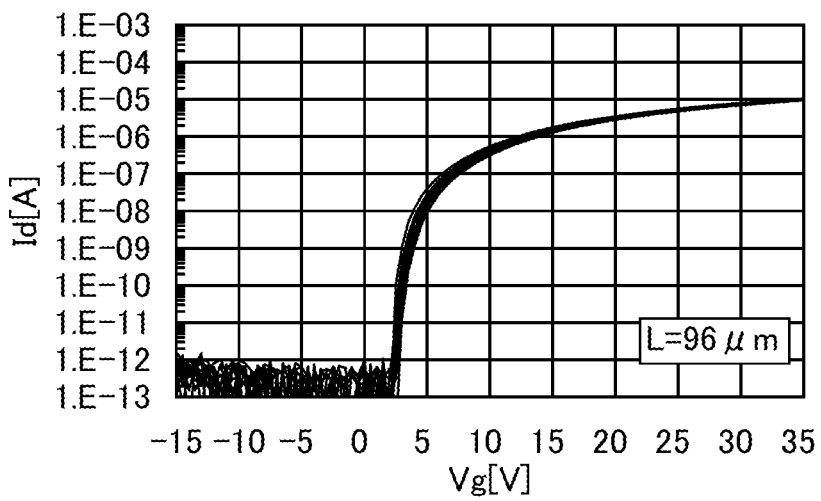
Figure 12A:
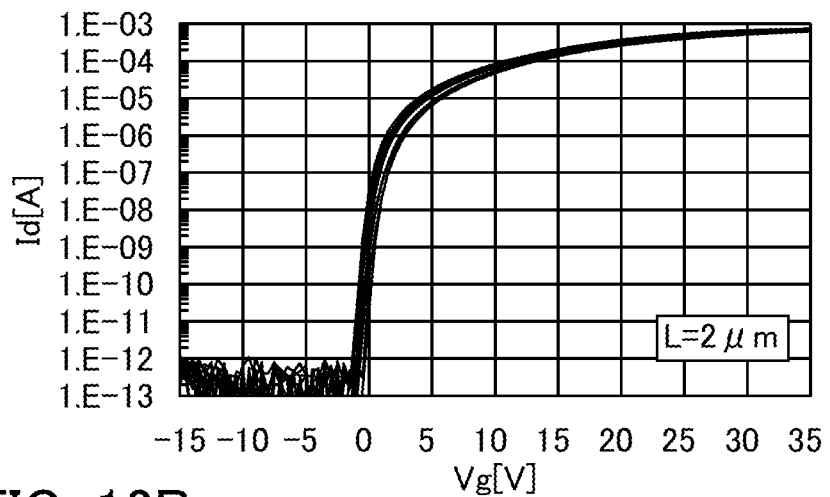
FIGS. 12A to 12C show results of electrical characteristics of transistors with channel lengths of 2, 3, 4 μm formed under Conditions D in Example 2.
Figure 12B:
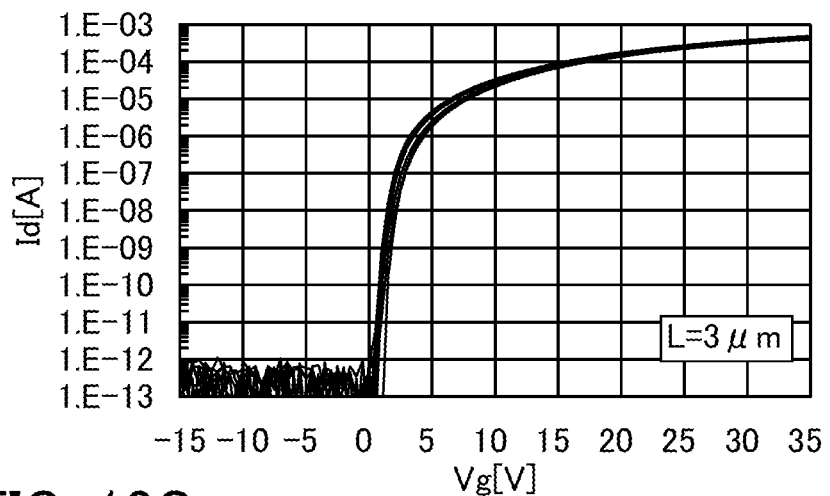
Figure 12C:
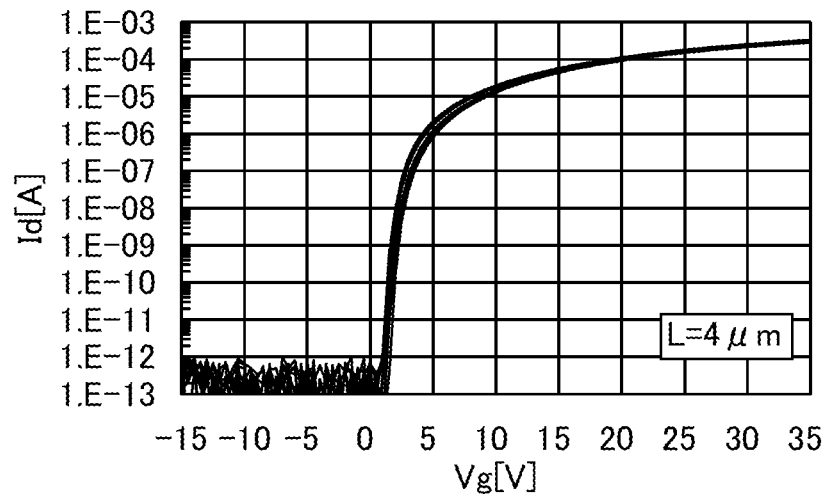
Figure 13A:
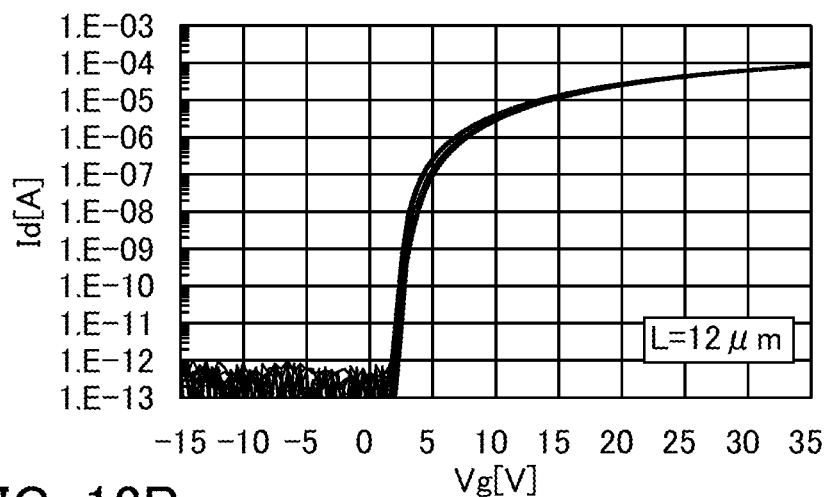
FIGS. 13A to 13C show results of electrical characteristics of transistors with channel lengths of 12, 46, 96 μm formed under Conditions D in Example 2.
Figure 13B:
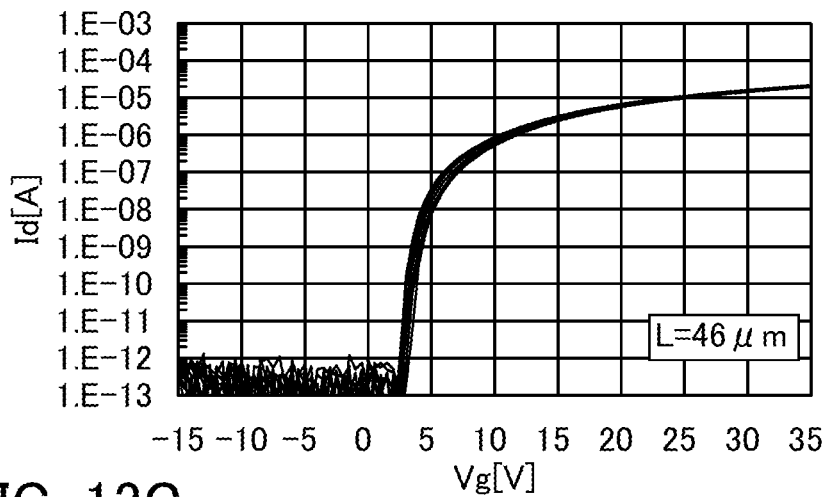
Figure 13C:
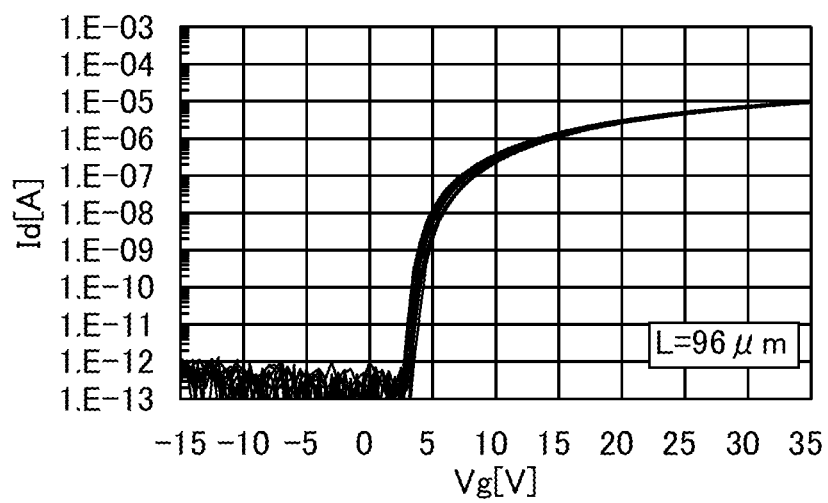

FIG. 6A shows results of the electrical characteristics of the transistors with a channel length L of 2 μm which are formed under Conditions A, FIG. 6B shows results of the electrical characteristics of the transistors with a channel length L of 3 μm which are formed under Conditions A, and FIG. 6C shows results of the electrical characteristics of the transistors with a channel length of 4 μm which are formed under Conditions A. FIG. 7A shows results of the electrical characteristics of the transistors with a channel length L of 12 μm which are formed under Conditions A, FIG. 7B shows results of the electrical characteristics of the transistors with a channel length L of 46 μm which are formed under Conditions A, and FIG. 7C shows results of the electrical characteristics of the transistors with a channel length L of 96 μm which are formed under Conditions A. Further, FIG. 8A shows results of the electrical characteristics of the transistors with a channel length L of 2 μm which are formed under Conditions B, FIG. 8B shows results of the electrical characteristics of the transistors with a channel length L of 3 μm which are formed under Conditions B, and FIG. 8C shows results of the electrical characteristics of the transistors with a channel length L of 4 μm which are formed under Conditions B. FIG. 9A shows results of the electrical characteristics of the transistors with a channel length L of 12 μm which are formed under Conditions B, FIG. 9B shows results of the electrical characteristics of the transistors with a channel length L of 46 μm which are formed under Conditions B, and FIG. 9C shows results of the electrical characteristics of the transistors with a channel length L of 96 μm which are formed under Conditions B. Furthermore, FIG. 10A shows results of the electrical characteristics of the transistors with a channel length L of 2 μm which are formed under Conditions C, FIG. 10B shows results of the electrical characteristics of the transistors with a channel length L of 3 μm which are formed under Conditions C, and FIG. 10C shows results of the electrical characteristics of the transistors with a channel length L of 4 μm which are formed under Conditions C. FIG. 11A shows results of the electrical characteristics of the transistors with a channel length L of 12 μm which are formed under Conditions C, FIG. 11B shows results of the electrical characteristics of the transistors with a channel length L of 46 μm which are formed under Conditions C, and FIG. 11C shows results of the electrical characteristics of the transistors with a channel length L of 96 μm which are formed under Conditions C. In addition, FIG. 12A shows results of the electrical characteristics of the transistors with a channel length L of 2 μm which are formed under Conditions D, FIG. 12B shows results of the electrical characteristics of the transistors with a channel length L of 3 μm which are formed under Conditions D, and FIG. 12C shows results of the electrical characteristics of the transistors with a channel length L of 4 μm which are formed under Conditions D. FIG. 13A shows results of the electrical characteristics of the transistors with a channel length L of 12 μm which are formed under Conditions D, FIG. 13B shows results of the electrical characteristics of the transistors with a channel length L of 46 μm which are formed under Conditions D, and FIG. 13C shows results of the electrical characteristics of the transistors with a channel length L of 96 μm which are formed under Conditions D.

In each of FIG. 6A to FIG. 13C showing the electrical characteristics of the transistors, the horizontal axis represents the gate voltage (V) (expressed as Vg below), the vertical axis represents the drain current (A) (expressed as Id below), and data for the twelve transistors are shown at a time. Further, the voltage (V) between the source electrode and the drain electrode (expressed as Vd below) was set at 10 V, and Vg was applied from −15 V to 35 V at intervals of 0.5 V.

According to FIG. 6A to FIG. 13C, some of the transistors with a channel length L of 2 μm formed under Conditions A, Conditions B, and Conditions C are brought into a conducting mode (normally on characteristics). Meanwhile the transistors with a channel length L of 2 μm manufactured under Conditions D are not brought into a conducting mode (normally on characteristics) and are thus found to have favorable transistor characteristics.

The results of Example 1 and Example 2 show that a higher ratio of $O_2$ flow rate and a higher substrate temperature at the time of forming an IGZO film tend to suppress conduction failures.

Further, the results show that in order for a transistor using an IGZO film with a channel length of 2 μm to be free from conducting-mode failures, the substrate temperature is preferably 200° C. and the ratio of $O_2$ flow rate at the time of forming the IGZO film is preferably 50%.

As described above, a change in film formation conditions of the IGZO film 308 influences electrical characteristics of the transistor, and the influence is particularly noticeable in the case of a transistor with a short channel length L of 2 μm. The transistors formed under Conditions D each have a peak indicating crystallinity at 2θ in the vicinity of 31°, which is described in Example 1, and thus each include a CAAC-OS film having a c-axis aligned in a direction parallel to a normal vector of a surface on which the IGZO film is formed.

Thus, it was revealed that the use of a CAAC-OS film in a transistor can suppress conducting mode (normally on characteristics) of electrical characteristics in the case where the transistor has a short channel length. That is, a transistor with a short channel length can be manufactured by using a CAAC-OS film.

This application is based on Japanese Patent Application serial no. 2012-093303 filed with Japan Patent Office on Apr. 16, 2012, the entire contents of which are hereby incorporated by reference.

What is claimed is:

1. A method for manufacturing a semiconductor device, comprising the steps of:
   forming a gate electrode over a substrate;
   forming a gate insulating layer over the gate electrode;
   forming an oxide semiconductor layer over the gate insulating layer by heating the substrate and sputtering a metal oxide target under a first condition;
   forming an active layer over the gate insulating layer by processing the oxide semiconductor layer; and
   forming a source electrode and a drain electrode over the active layer so that a length of a channel formed in the active layer is more than or equal to 1 μm and less than or equal to 50 μm,
   wherein the first condition is a condition where the substrate is heated at more than or equal to 170° C. in an atmosphere including an oxygen gas and a rare gas at a ratio of the oxygen gas flow rate to a total gas flow of more than or equal to 30%,
   wherein a diffraction intensity of the oxide semiconductor layer in X-ray diffraction measurement has a peak at a rotation angle 2θ of more than or equal to 30° and less than or equal to 32°,
   wherein an atomic ratio of indium, gallium and zinc in the metal oxide target is 1:1:1.5, respectively,
   wherein the oxide semiconductor layer is an In—Ga—Zn-based oxide layer, and
   wherein an atomic ratio of indium, gallium and zinc in the oxide semiconductor layer is 1:1:1, respectively.

2. The method for manufacturing a semiconductor device according to claim 1, wherein the oxide semiconductor layer has a band gap of more than or equal to 3.1 eV.

3. The method for manufacturing a semiconductor device according to claim 1, wherein the length of the channel is less than 5 μm.

4. The method for manufacturing a semiconductor device according to claim 1,
   wherein the oxide semiconductor layer includes a crystal part, and
   wherein a c-axis of the crystal part is aligned in a direction substantially parallel to a normal vector of a surface on which the oxide semiconductor layer is formed.

5. A method for manufacturing a semiconductor device, comprising the steps of:
   forming a gate electrode over a substrate;
   forming a gate insulating layer over the gate electrode;
   forming an oxide semiconductor layer over the gate insulating layer by heating the substrate and sputtering a metal oxide target under a first condition;
   forming an active layer over the gate insulating layer by processing the oxide semiconductor layer; and
   forming a source electrode and a drain electrode over the active layer so that a length of a channel formed in the active layer is more than or equal to 1 μm and less than or equal to 50 μm,
   wherein the first condition is a condition where the substrate is heated at more than or equal to 100° C. in an atmosphere including an oxygen gas and a rare gas at a ratio of the oxygen gas flow rate to a total gas flow of more than or equal to 70%,
   wherein a diffraction intensity of the oxide semiconductor layer in X-ray diffraction measurement has a peak at a rotation angle 2θ of more than or equal to 30° and less than or equal to 32°,
   wherein an atomic ratio of indium, gallium and zinc in the metal oxide target is 1:1:1.5, respectively,
   wherein the oxide semiconductor layer is an In—Ga—Zn-based oxide layer, and
   wherein an atomic ratio of indium, gallium and zinc in the oxide semiconductor layer is 1:1:1, respectively.

6. The method for manufacturing a semiconductor device according to claim 5, wherein the oxide semiconductor layer has a band gap of more than or equal to 3.1 eV.

7. The method for manufacturing a semiconductor device according to claim 5, wherein the length of the channel is less than 5 μm.

8. The method for manufacturing a semiconductor device according to claim 5,
   wherein the oxide semiconductor layer includes a crystal part, and
   wherein a c-axis of the crystal part is aligned in a direction substantially parallel to a normal vector of a surface on which the oxide semiconductor layer is formed.

* * * * *